(12) United States Patent
Hsu et al.

(10) Patent No.: US 8,768,672 B2
(45) Date of Patent: Jul. 1, 2014

(54) METHOD FOR PREDICTING TIME-LAPSE SEISMIC TIMESHIFTS BY COMPUTER SIMULATION

(75) Inventors: Sheng-Yuan Hsu, Sugar Land, TX (US); Kevin H. Searles, Kingwood, TX (US)

(73) Assignee: ExxonMobil. Upstream Research Company, Houston, TX (US)

(*) Notice: Subject to any disclaimer, the term of this patent is extended or adjusted under 35 U.S.C. 154(b) by 541 days.

(21) Appl. No.: 13/053,875

(22) Filed: Mar. 22, 2011

(65) Prior Publication Data

US 2011/0170373 A1 Jul. 14, 2011

Related U.S. Application Data

(63) Continuation-in-part of application No. 12/665,597, filed on Dec. 18, 2009, now Pat. No. 8,423,337.

(51) Int. Cl.
*G06G 7/48* (2006.01)
*G06G 7/50* (2006.01)
*G01V 1/28* (2006.01)
*G01V 11/00* (2006.01)
*E21B 47/00* (2012.01)
*G06F 17/50* (2006.01)

(52) U.S. Cl.
CPC .............. *G01V 1/282* (2013.01); *G01V 11/00* (2013.01); *E21B 47/00* (2013.01); *G06F 17/5009* (2013.01)
USPC ..................................... 703/10; 703/7; 703/9

(58) Field of Classification Search
CPC .... G06F 17/5009; G01V 11/00; G01V 1/282; E21B 47/00
USPC .................................... 703/10, 7, 9
See application file for complete search history.

(56) References Cited

U.S. PATENT DOCUMENTS 3,829,685 A 8/1974 McKay
3,870,879 A 3/1975 McKay
(Continued)

FOREIGN PATENT DOCUMENTS

WO WO 2007/116008 A1 10/2007
WO WO 2008/131351 A1 10/2008

OTHER PUBLICATIONS

Baeten, G.J.M., et al., Directional Deconvultion in the F-X Domain, Abstract 1991:5004, Sep. 23-27, 1990, 60th Annual Seg. Int'l Meeting.

(Continued)

*Primary Examiner* — Omar Fernandez Rivas
*Assistant Examiner* — Angel Calle
(74) *Attorney, Agent, or Firm* — ExxonMobil Upstream Research Company-Law Department

(57) ABSTRACT

A method for predicting time-lapse seismic timeshifts in a three-dimensional geomechanical system including defining physical boundaries for the geomechanical system. In addition, one or more reservoir characteristics such as pore pressure and/or temperature history are acquired from multiple wells within the physical boundaries. The method also includes determining whether a formation in the geomechanical system is in an elastic regime or a plastic regime. The method also includes obtaining first and second seismic data sets for the geomechanical system, taken at first and second times. The method also includes running a geomechanical simulation to simulate the effects of changes in pore pressure or other reservoir characteristic on time-lapse seismic timeshifts in the formation.

48 Claims, 11 Drawing Sheets

(56) References Cited

U.S. PATENT DOCUMENTS

| | | |
|---|---|---|
| 4,797,822 A | 1/1989 | Peters |
| 4,821,242 A | 4/1989 | Hennington |
| 5,058,012 A | 10/1991 | Hinchman et al. |
| 5,321,612 A | 6/1994 | Stewart |
| 5,416,697 A | 5/1995 | Goodman |
| 5,619,475 A | 4/1997 | Winkler |
| 5,740,342 A | 4/1998 | Kocberber |
| 5,848,379 A | 12/1998 | Bishop |
| 5,892,732 A | 4/1999 | Gersztenkorn |
| 5,930,730 A | 7/1999 | Marfurt et al. |
| 5,986,974 A | 11/1999 | Luo et al. |
| 6,078,869 A | 6/2000 | Gunasekera |
| 6,106,561 A | 8/2000 | Farmer |
| 6,131,071 A | 10/2000 | Partyka et al. |
| 6,196,318 B1 | 3/2001 | Gong et al. |
| 6,256,603 B1 | 7/2001 | Celniker |
| 6,266,619 B1 | 7/2001 | Thomas et al. |
| 6,460,006 B1 | 10/2002 | Corcoran |
| 6,510,389 B1 | 1/2003 | Winkler et al. |
| 6,549,854 B1 | 4/2003 | Malinverno et al. |
| 6,597,995 B1 | 7/2003 | Cornu et al. |
| 6,640,190 B2 | 10/2003 | Nickel |
| 6,654,692 B1 | 11/2003 | Neff |
| 6,668,922 B2 | 12/2003 | Ziauddin et al. |
| 6,745,159 B1 | 6/2004 | Todd et al. |
| 6,751,558 B2 | 6/2004 | Huffman et al. |
| 6,754,587 B1 | 6/2004 | Trappe et al. |
| 6,766,255 B2 | 7/2004 | Stone |
| 6,785,641 B1 | 8/2004 | Huang |
| 6,804,609 B1 | 10/2004 | Brumbaugh |
| 6,810,332 B2 | 10/2004 | Harrison |
| 6,813,564 B2 | 11/2004 | Eiken et al. |
| 6,836,731 B1 | 12/2004 | Whalley et al. |
| 6,840,317 B2 | 1/2005 | Hirsch et al. |
| 6,842,700 B2 | 1/2005 | Poe |
| 6,892,812 B2 | 5/2005 | Niedermayr et al. |
| 6,901,391 B2 | 5/2005 | Storm, Jr. et al. |
| 6,941,255 B2 | 9/2005 | Kennon et al. |
| 6,947,843 B2 | 9/2005 | Fisher et al. |
| 6,978,210 B1 | 12/2005 | Suter et al. |
| 6,980,929 B2 | 12/2005 | Aronstam et al. |
| 6,980,940 B1 | 12/2005 | Gurpinar et al. |
| 6,991,032 B2 | 1/2006 | Berchenko et al. |
| 7,043,410 B2 | 5/2006 | Malthe-Sorenssen et al. |
| 7,054,752 B2 | 5/2006 | Zabalza-Mezghani et al. |
| 7,062,420 B2 | 6/2006 | Poe, Jr. |
| 7,066,019 B1 | 6/2006 | Papanastasiou |
| 7,089,166 B2 | 8/2006 | Malthe-Sorenssen et al. |
| 7,089,167 B2 | 8/2006 | Poe |
| 7,099,811 B2 | 8/2006 | Ding et al. |
| 7,113,869 B2 | 9/2006 | Xue |
| 7,177,764 B2 | 2/2007 | Stone |
| 7,181,380 B2 | 2/2007 | Dusterhoft et al. |
| 7,188,058 B2 | 3/2007 | Hardy et al. |
| 7,191,062 B2 | 3/2007 | Chi et al. |
| 7,200,539 B2 | 4/2007 | Ong et al. |
| 7,242,637 B2 | 7/2007 | Van Den Beukel et al. |
| 7,369,979 B1 | 5/2008 | Spivey |
| 7,461,691 B2 | 12/2008 | Vinegar et al. |
| 7,561,998 B2 | 7/2009 | Panga et al. |
| 7,577,061 B2 | 8/2009 | Williamson et al. |
| 7,603,261 B2 | 10/2009 | Tardy |
| 7,657,415 B2 | 2/2010 | Panga et al. |
| 7,751,979 B2 | 7/2010 | Molenaar |
| 8,325,560 B2 * | 12/2012 | Westeng et al. .................. 367/38 |
| 2002/0013687 A1 | 1/2002 | Ortoleva |
| 2002/0029137 A1 | 3/2002 | Malthe-Sorenssen et al. |
| 2002/0049575 A1 | 4/2002 | Jalali et al. |
| 2002/0055868 A1 | 5/2002 | Dusevic et al. |
| 2002/0120429 A1 | 8/2002 | Ortoleva |
| 2002/0169559 A1 | 11/2002 | Onyia et al. |
| 2003/0018435 A1 | 1/2003 | Jenner et al. |
| 2004/0010373 A1 | 1/2004 | Smits et al. |
| 2004/0122640 A1 | 6/2004 | Dusterhoft |
| 2004/0199329 A1 | 10/2004 | Stone |
| 2005/0015204 A1 | 1/2005 | Xue |
| 2005/0015231 A1 | 1/2005 | Edwards et al. |
| 2005/0043890 A1 | 2/2005 | Sanstrom |
| 2005/0065730 A1 | 3/2005 | Sinha |
| 2005/0121197 A1 | 6/2005 | Lopez de Cardenas et al. |
| 2005/0125203 A1 | 6/2005 | Hartman |
| 2005/0149307 A1 | 7/2005 | Gurpinar et al. |
| 2005/0197813 A1 | 9/2005 | Grayson |
| 2005/0199391 A1 | 9/2005 | Cudmore et al. |
| 2005/0209836 A1 | 9/2005 | Klumpen et al. |
| 2005/0234690 A1 | 10/2005 | Mainguy et al. |
| 2005/0267719 A1 | 12/2005 | Foucault |
| 2005/0273302 A1 | 12/2005 | Huang et al. |
| 2005/0273304 A1 | 12/2005 | Oliver et al. |
| 2006/0015310 A1 | 1/2006 | Husen et al. |
| 2006/0047431 A1 | 3/2006 | Geiser |
| 2006/0047489 A1 | 3/2006 | Scheidt et al. |
| 2006/0085174 A1 | 4/2006 | Hemanthkumar et al. |
| 2006/0100837 A1 | 5/2006 | Symington et al. |
| 2006/0129366 A1 | 6/2006 | Shaw |
| 2006/0149518 A1 | 7/2006 | Oliver et al. |
| 2006/0153005 A1 | 7/2006 | Herwanger et al. |
| 2006/0224370 A1 | 10/2006 | Siebrits et al. |
| 2007/0083330 A1 | 4/2007 | Frenkel |
| 2007/0156377 A1 | 7/2007 | Gurpinar et al. |
| 2007/0244681 A1 | 10/2007 | Cohen et al. |
| 2007/0265782 A1 | 11/2007 | Kleinberg et al. |
| 2007/0271077 A1 | 11/2007 | Kosmala et al. |
| 2007/0294034 A1 | 12/2007 | Bratton et al. |
| 2008/0015831 A1 | 1/2008 | Tardy et al. |
| 2008/0015832 A1 | 1/2008 | Tardy |
| 2008/0033656 A1 | 2/2008 | Herwanger |
| 2008/0053213 A1 | 3/2008 | Birchwood |
| 2008/0071505 A1 | 3/2008 | Huang et al. |
| 2008/0195358 A1 * | 8/2008 | El Ouair et al. .................. 703/2 |
| 2008/0319674 A1 | 12/2008 | Dai et al. |
| 2009/0055098 A1 | 2/2009 | Mese et al. |
| 2009/0116338 A1 | 5/2009 | Hoetz |
| 2009/0294122 A1 | 12/2009 | Hansen et al. |
| 2010/0326669 A1 * | 12/2010 | Zhu et al. ...................... 166/369 |
| 2011/0042080 A1 * | 2/2011 | Birchwood et al. ........ 166/254.2 |
| 2011/0103184 A1 * | 5/2011 | Westeng et al. .................. 367/38 |

OTHER PUBLICATIONS

Da Silva, F.V., et al., "Casing Collapse Analysis Associated with Reservoir Compaction and Overburden Subsidence", SPE 20953, Oct. 23-24, 1990, pp. 127-133, Europec 90, The Hague, Netherlands.

Fredrich, J.T., et al., "Three-Dimensional Geomechanical Simulation of Reservoir Compaction and Implications for Well Failures in the Belridge Diatomite", SPE 36698, Oct. 6-9, 1996, pp. 195-210, 1996 SPE Annual Technical Conf. and Exh., Denver, CO.

Häusler, H., et al., "A New Exploration Approach in a Mature Basin: Integration of 3-D Seismic, Remote-Sensing, and Microtectonic Data, Southern Vienna Basin, Austria", 2002, pp. 433-451, AAPG Studies in Geology No. 48 and SEG Geophysical References Series No. 11.

Lee, T-Y., et al., "History Matching by Spline Approximation and Regularization in Single-Phase Areal Reservoirs", Sep. 1986, pp. 521-534, SPE Reservoir Engineering.

Olden, P., et al., "Modeling Combined Fluid and Stress Change Effects in the Seismic Response of a Producing Hydrocarbon Reservoir", Oct. 2001, pp. 1154-1157, The Leading Edge.

Pöppelreiter, M., et al., "Structural Control on Sweet-Spot Distribution in a Carbonate Reservoir: Concepts and 3-D Models (Cogollo Group, Lower Cretaceous, Venezuela)", Dec. 2005, pp. 1651-1676, vol. 89, No. 12, AAPG Bulletin.

Roumboutsos, A., "The Application of Deconvolution in Well Test Analysis", Abstract 1989:20444, Dissertation, Jul. 1989, Heriot Watt University.

Schutjens, P., "On the Stress Change in Overburden Resulting from Reservoir Compaction: Observations from Two Computer Models and Implications for 4D Seismic", May 2007, pp. 628-634, The Leading Edge.

(56) References Cited

OTHER PUBLICATIONS

Barkved, O. I. et al., "Seismic time-lapse effects and stress changes: Examples from a compacting reservoir", The Leading Edge, Dec. 2005, pp. 1244-1248.

Johnston, D.H., "A Tutorial on Time-Lapse Seismic Reservoir Modeling", Offshore Technology Conference, May 5-8, 1997, pp. 141-146, Houston, Texas.

Minkoff et al., Coupled Geomechanics and Flow Simulation for Time-Lapse Seismic Modeling, Geophysics, Jan.-Feb. 2004, pp. 311-322, vol. 69, No. 1.

Staples R. et al., "Monitoring pressure depletion and improving geomechanical models of the Shearwater Field using 4D seismic", The Leading Edge, May 2007, pp. 636-642.

Tura, A. et al., "Feasibility of monitoring compaction and compartmentalization using 4D time shifts and seafloor subsidence", The Leading Edge, Sep. 2006, pp. 1169-1175.

Tura, A. et al., "Monitoring primary depletion reservoirs using amplitudes and time shifts from high-repeat seismic surveys", The Leading Edge, Dec. 2005, pp. 1214-1221.

\* cited by examiner

METHOD FOR PREDICTING TIME-LAPSE SEISMIC TIMESHIFTS BY COMPUTER SIMULATION

CROSS REFERENCE TO RELATED APPLICATIONS

This application is a Bypass Continuation-In-Part of U.S. application Ser. No. 12/665,597, filed 18 Dec. 2009. which issued on 16 Apr. 2013 as U.S. Pat. No. 8,423,337, which claims benefit of International Application No. PCT/US2008/007238, filed 10 Jun. 2008, and U.S. Provisional Application No. 60/966,031, filed 24 Aug. 2007, and which is incorporated herein in its entirety for all purposes. This application is also the National Stage of International Application No. PCT/US2009/051158, filed 20 Jul. 2009, which claims the benefit of U.S. Provisional Application No. 61/106,879, filed 20 Oct. 2008, which is incorporated herein in its entirety for all purposes.

FIELD OF THE INVENTION

The present invention relates to the field of geomechanical modeling. More specifically, the present invention relates to the use of geomechanical modeling to predict time-lapse seismic timeshifts associated with hydrocarbon recovery processes within strained geologic formations.

DISCUSSION OF TECHNOLOGY

A subterranean hydrocarbon-bearing reservoir is confined by a state of in-situ tectonic stress. In addition, a hydrocarbon-bearing reservoir resides in a state of pressure due to the presence of fluids residing within interstitial pore spaces. The in situ hydrocarbons provide pore pressure which acts against the overburden and supports the rock strata above the formation.

When producing hydrocarbons from the reservoir, the stress state of the reservoir may change. This is because the removal of in situ fluids from a subsurface formation causes a reduction in pore pressure. As pore pressure is reduced, the weight of the overburden is increasingly supported by the rock matrix. This in turn causes a compaction of rock layers within the subsurface formation in response to the increased stress. This is particularly true when the rock matrix in the subsurface reservoir is weak.

A compaction of rock layers within the subsurface formation also affects rock layers above the reservoir. In this respect, as layers within a reservoir compact, rock layers above the reservoir may undergo dilation. The result is that the thickness of various rock layers within one or more subsurface formations is changed over the life of a hydrocarbon-bearing reservoir.

The inverse of the above processes can occur in connection with fluid injection. Injection operations may be conducted as part of enhanced oil recovery, such as the injection of steam or brine into a producing formation. Injection operations may also occur simply in connection with a water disposal program. The injection of fluids into the subsurface formation will cause an increase in pore pressure within the targeted formation. This, in turn, can create stresses in the formation that may cause dilation in rock layers within a hydrocarbon-bearing formation. At the same time, this may induce compaction within rock layers existing in formations above the reservoir. The result again is that the thickness of various rock layers is changed over the life of a hydrocarbon-bearing reservoir.

It is desirable for a reservoir analyst to learn about changes in rock layer thicknesses during the course of reservoir production and depletion. Changes in rock layer thickness can indicate a depletion of reservoir fluids. Reciprocally, an absence of changes in rock layer thickness can indicate the presence of remaining reservoir fluids.

One method in which rock layer thickness can be determined is through seismic surveys. As one of ordinary skill in the art will understand, seismic exploration methods are employed for the purpose of obtaining knowledge about geological structures in the subsurface. Seismic exploration represents an attempt to map the subsurface of the earth by sending sound energy down into the ground, and then recording "echoes" that return from the rock layers below. The sound energy is in the form of "P" waves and "S" waves that are passed into the earth's subsurface strata.

The source of the down-going sound energy typically comes from explosive charges or seismic vibrators. In a marine environment, air guns are more commonly used. Seismic testing employs sensors such as geophones and hydrophones. The sensors are lined up successively to receive the returned waves, or echoes. The returning waves are registered on the surface by the sensors as digital samples. The digital samples are usually acquired at 0.004 second (4 millisecond) intervals, although 2 millisecond and 1 millisecond intervals are also known. Thus, each sample is associated with a travel time, including a two-way travel time in the case of reflected energy.

During a seismic survey, the sound energy source is moved across the surface above the geologic structure of interest. Each time the source is detonated, it is recorded at various locations on the surface of the earth by the sensors in the form of a time series. Such a time series represents the incoming seismic energy by amplitude variations. Multiple explosion/recording combinations are compiled to create a near continuous profile of the subsurface that can extend for many miles. The end result is a depiction of the geological layers.

A correlation exists between the thickness of a rock layer and the time it takes a sound wave to travel through that rock layer and then return to the surface. A correlation also exists between rock material properties and the speed or velocity at which sound waves travel through the rock media. Seismic processing takes advantage of these correlations to create digital images of the rock layers. The digital images show thicknesses of the individual rock layers.

It is known to run new seismic surveys for a hydrocarbon development area after production operations commence. The purpose of the new runs is to compare the thicknesses of rock layers within the hydrocarbon-bearing formation before and after the commencement of production. Post-production rock layer thicknesses can be compared with pre-production thicknesses as a way of viewing the effects of production activities on individual rock layers. The new or subsequent survey is known as a time-lapse seismic survey.

As noted, depletion of reservoir fluids can lead to a change in rock layer thickness. This creates a change in the travel time of seismic waves traveling down to and back from the individual rock layers. This change is known as a "timeshift." Timeshifts can also be caused by changes in the geomechanical stress state of rock material in a stratum. In this respect, as the rock material changes from an elastic state to a more plastic state, wave velocities through the stratum may change. This, in turn, affects the travel time.

Timeshifts of seismic P and S waves passing through the rocks provide insight into the state of reservoir and surrounding formations, such as the aerial distribution of reservoir compaction or dilation. Timeshifts of seismic surveys can also provide information about the state of stress within the overburden and whether it provides adequate support through stress arching or if it is nearing a critical tensile condition.

Running post-production seismic surveys is expensive. Therefore, it is desirable to utilize a computer-based simulation that allows the reservoir analyst to simulate changes in rock layer thicknesses in the future based on anticipated changes in formation pore pressure and geomechanical stress. In this way, forward-looking time-lapse seismic timeshifts are created. It is also desirable to use a full-physics based computer model to run the simulation wherein both reservoir fluid properties and geomechanical forces are taken into account. The geomechanical forces include both stress and strain. The computer model may then more accurately simulate future timeshifts based upon changes in fluid properties and/or geomechanical forces.

SUMMARY OF THE INVENTION

A computer-implemented method for predicting time-lapse seismic timeshifts in a three-dimensional geomechanical system is provided. Preferably, the geomechanical system is a hydrocarbon reservoir.

The method comprises defining physical boundaries for the geomechanical system. In addition, at least one reservoir characteristic is acquired from multiple wells within the physical boundaries. In one aspect, the at least one reservoir characteristic is pore pressure history. However, it may alternatively be porosity, permeability, temperature history, or combinations thereof.

The method also includes determining whether a formation in the geomechanical system is in an elastic regime or a plastic regime. The method also includes obtaining a first seismic data set for the geomechanical system. The first seismic data set is taken at a first time. The method further includes obtaining a second seismic data set for the geomechanical system. The second seismic data set is taken at a second time. The second seismic data set may be taken from a post-production seismic survey. More preferably herein, the second seismic data set is obtained as part of a geomechanical simulation. In one aspect, the second seismic data set comprises "P" wave velocity through rock layers within the formation, "S" wave velocity through rock layers within the formation, or combinations thereof.

The method also includes running a geomechanical simulation for the geomechanical system to simulate the effects of changes in the at least one reservoir characteristic on time-lapse seismic timeshifts in the formation. In one aspect, running a geomechanical simulation comprises calculating incremental timeshifts for a plurality of layers within the formation, and calculating a cumulative timeshift value from a summation of the incremental timeshifts in the formation.

Different mathematical approaches are taken for determining incremental timeshifts for the layers, depending on whether the formation is in an elastic regime or a plastic regime. If the formation is an elastic regime, the incremental timeshifts may be determined based on strain measurements in the formation. The equation may be written as:

$$\Delta t_i = 2 t_i \times \epsilon_i$$

where: $\Delta t_i$=incremental timeshift of a seismic wave within a layer i in a formation,
$t_i$=one-way travel time of the seismic wave within the layer i, and
$\epsilon_i$=strain in the layer i.

On the other hand, if the formation is in a plastic regime, incremental timeshifts may be determined based on both strain measurements in the formation and stress measurements. The equation may be written as:

$$\Delta t_i = 2 t_i \left( \epsilon_i - \frac{dv_i}{v_i} \right)$$

where: $\Delta t_i$=incremental timeshift of a seismic wave within a layer i in a formation,
$t_i$=one-way travel time of a seismic wave within the layer
$\epsilon_i$=strain in the layer i, and $\frac{dv_i}{v_i}$ = change in wave velocity in the layer $i$ between the first and second times, divided by the original wave velocity at the first time.

The expression $v_i$ is the original velocity of seismic waves through the formation at the first time. The expression $dv_i$ represents the change in velocity of the waves between the first and second times.

The seismic waves may be either "P" waves or "S" waves. Where the seismic waves are "P" waves, $v_i$ may be computed as:

$$v_i = \sqrt{\frac{\lambda + 2\mu}{\rho}}$$

where: $\lambda$=Lame' constant,
$\mu$=shear modulus, and
$\rho$=density of the rock layer i.

Where the seismic waves are "S" waves, $v_i$ may be computed as:

$$v_i = \sqrt{\frac{\mu}{\rho}}$$

where: $\mu$=shear modulus, and
$\rho$=density of the rock layer i.

In one aspect, layers within more than one formation are examined. In this instance, running a geomechanical simulation may comprises calculating incremental timeshifts for layers within at least two formations within the geomechanical system; and calculating cumulative timeshift values from a summation of the incremental timeshifts in at least two of the formations in order to create a multi-formation time-lapse timeshift profile. In this instance, the cumulative timeshift values may each be defined as:

$$\Delta T_i = \sum_i \Delta t_i$$

where: $\Delta T_i$=cumulative timeshift value for all layers i in the at least two formations, and
$\Delta t_i$=incremental timeshift in a layer i within the formations.

Preferably, the method includes additional steps prior to running the geomechanical simulation. These include acquiring mechanical properties of rock formations within the physical boundaries, and automatically creating a finite element mesh representing the geomechanical system. Here, the mesh defines a plurality of nodes representing points in space, with each point having potential displacement in more than one direction. The mesh preferably provides a positive value for any rock formations having a zero thickness as derived from subsurface data. In this way, a positive volume is created for each rock formation.

The method may also include mapping pore pressure within the geomechanical system at a first time for nodes within the mesh, and mapping pore pressure within the geomechanical system at a plurality of additional times to correspond to the nodes within the mesh. In this manner a pore pressure history is mapped and interpolations may be conducted.

In one embodiment, prior to running a geomechanical simulation, the method further comprises acquiring subsurface data for the rock formations. The subsurface data represents well logging data, seismic data, or combinations thereof. The physical boundaries for the geomechanical system and the subsurface data for the rock formations within the physical boundaries may be entered into a pre-processor program. The purpose is to create a three-dimensional grid in a map-based computer model. The three-dimensional grid is automatically compiled from the subsurface data. The three-dimensional grid defines nodes in a geological structure that are converted into the nodes of the finite element mesh as a result of creating the finite element mesh.

BRIEF DESCRIPTION OF THE DRAWINGS

So that the manner in which the present invention can be better understood, certain drawings and flowcharts are appended hereto. It is to be noted, however, that the drawings illustrate only selected embodiments of the inventions and are therefore not to be considered limiting of scope, for the inventions may admit to other equally effective embodiments and applications.

FIG. 13A is a plane view of a development area after 7.3 years of production. Pore pressure within the formation is mapped along a given depth. Areas of depletion are shown in lighter shades of gray.

FIG. 13B is a side view of subsurface strata taken across line A-A' of FIG. 13A. The top of the reservoir is indicated at 0 feet, being the earth surface. Timeshifts in the strata are shown.

DETAILED DESCRIPTION

Definitions

Figure 1:
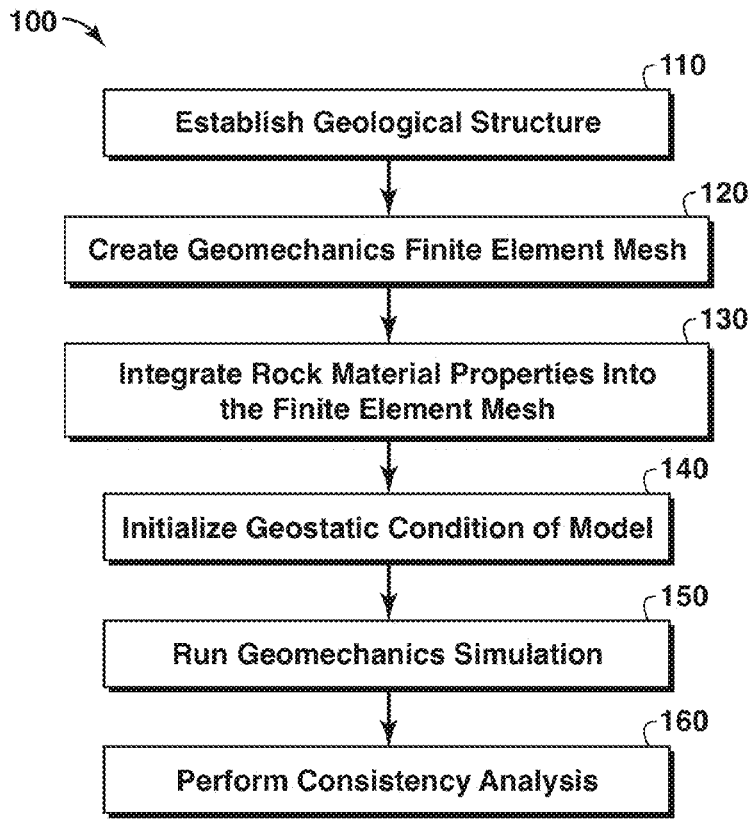
FIG. 1 is a flow diagram illustrating a geomechanical modeling method according to one embodiment of the invention.

As used herein, the term "burial" refers to a geologic process, whether continuous or discontinuous, and whether related to sedimentary deposition, volcanic eruption and/or other geologic process wherein multiple strata are placed in a substantially successive manner, one stratum atop another, in a corresponding series of stratum-producing phases leading to a formation's creation. As used herein, where the term "burial" is associated with a rock property value (e.g., Poisson's Ratio or Young's Modulus) for a stratum of interest, the term designates a virtual value of the rock property for each stratum considered pertinent to developing a stratigraphic model suitable for performing the desired stress analysis of the formation. Depending on the formation, the oldest stratum and the successively newer strata of interest can be produced in any one of the primary geologic eras.

"Lithology" means a description of the physical and approximate compositional character of a rock based on a variety of rock attributes, including without limitation, color, structures, grain size and mineralogic components. One or more of these attributes may be determined by visual evaluation (by eye alone or assisted by a magnifier), seismic interpretation and/or well log interpretation.

"Strain" means a measure of the extent to which a body of material is deformed and/or distorted when it is subjected to a stress-inducing force. "Stress-Inducing Force" refers to an action of at least one force, load and/or constraint on a body of material that tends to strain the body. Examples of the body's deformation or distortion can include, without limitation, changes in the body's length (e.g., linear strain), volume (e.g., bulk strain) and/or a lateral displacement between two substantially parallel planes of material within the body (e.g., shear strain).

"Stress" is a measure of inter-particle forces arising within a body of material resisting deformation and/or distortion, in response to a stress-inducing force applied to the body, as particles within the body of material work to resist separation, compression and/or sliding.

"Principal Stress" means any one of three inherent normal stresses, each perpendicular to the other, in a predetermined coordinate system where the three corresponding shear stresses are equal to zero. Generally, though not always, one of the principal stresses is substantially vertical in a formation, while the two remaining principal stresses are substantially horizontal. While there is no requirement for the principal stresses to be vertical or horizontal, for ease of discussion herein, the three principal stresses, are referred to as principal vertical stress, $\sigma_{vert}$, greater principal horizontal stress, $\sigma_{horiz-1}$, and lesser principal horizontal stress, $\sigma_{horiz-2}$.

"Poisson Ratio," or "v," means, for a substantially elastic body of material when placed under a substantially uniaxial stress, the ratio of the strain normal to the uniaxial stress to the strain parallel to the uniaxial stress.

"Elastic stress to-strain modulus" means a ratio of stress applied to a body versus the strain produced. Elastic stress-to-strain moduli include, without limitation, Young's Modulus, ("E"), bulk modulus ("K"), and shear modulus ("$\mu$").

"Young's Modulus" ("E") means, for a substantially elastic body of material when placed under a substantially uniaxial stress less than the material's yield strength, whether a tension or compression stress, the ratio of the uniaxial stress, acting to change the body's length (parallel to the stress), to the fractional change in the body's length.

"Elastic" means a body of material capable of sustaining deformation and/or distortion without permanent loss of size or shape in response to a stress-inducing force, whether the body's response is linear elastic or non-linear elastic.

"Inelastic" or "Plastic" means that any deformation and/or distortion to a body of material subjected to a stress-inducing force is permanent, i.e. deformation/distortion remains after the force is removed.

"Yield Strength" means the stress value at which deformation resulting from a stress-inducing force becomes permanent. At that stress value, a body of material, which previously exhibited an elastic response, will begin to exhibit a plastic response to the stress-inducing force.

"Subsurface" means beneath the top surface of any mass of land at any elevation or over a range of elevations, whether above, below or at sea level, and/or beneath the floor surface of any mass of water, whether above, below or at sea level.

"Formation" means a subsurface region, regardless of size, comprising an aggregation of subsurface sedimentary, metamorphic and/or igneous matter, whether consolidated or unconsolidated, and other subsurface matter, whether in a solid, semi-solid, liquid and/or gaseous state, related to the geological development of the subsurface region. A formation may contain numerous geologic strata or layers of different ages, textures and mineralogic compositions. A formation can refer to a single set of related geologic strata of a specific rock type, or to a whole set of geologic strata of different rock types that contribute to or are encountered in, for example, without limitation, (i) the creation, generation and/or entrapment of hydrocarbons or minerals and (ii) the execution of processes used to extract hydrocarbons or minerals from the subsurface.

"Tectonic" means pertaining to, causing or arising from a subsurface region's movement and/or deformation, whether by vibration and/or displacement, including, without limitation, rock faulting, rock folding and/or a volcanic event.

"Calibrated" means to bring a numerical model to a state consistent with observed conditions within a degree of deviation acceptable for the desired analysis. For example, a formation model may be calibrated to a state of virgin stress distribution (i.e., before any man-induced, stress-altering event occurs in the formation). It will be understood, however, that a model can be calibrated to another stress state of interest including, without limitation, a formation's present-day, non-virgin stress distribution, by first calibrating to a virgin stress distribution based on stress data obtained (i) from at least one location in the formation not materially affected by the man-induced event and/or (ii) before the man-induced event occurred in the formation. Once a formation is calibrated to its virgin stress distribution, any man-induced, stress-altering events can then be accounted for to bring the model to a present-day, non-virgin stress distribution.

Description of Selected Specific Embodiments

FIG. 1 presents a flow diagram illustrating a geomechanical modeling method 100 according to one embodiment. The method 100 sets out steps that may be followed for the purpose of developing a numerically tractable, multi-scale geomechanical modeling framework suitable for computer simulation.

In accordance with the method 100, the first step is to establish a geologic structure for the reservoir under study. This step is represented by Box 110. The purpose is to create a three-dimensional, map-based model from subsurface data.

In creating the geologic structure 110, the geologist or engineer (sometimes referred to generically herein as "the analyst") acquires one or more types of subsurface data. Such data may include well logging data, seismic data, or reservoir simulation data. The analyst then applies certain computer-implemented tools to generate a map representing the geological structure of the production area.

Figure 2:
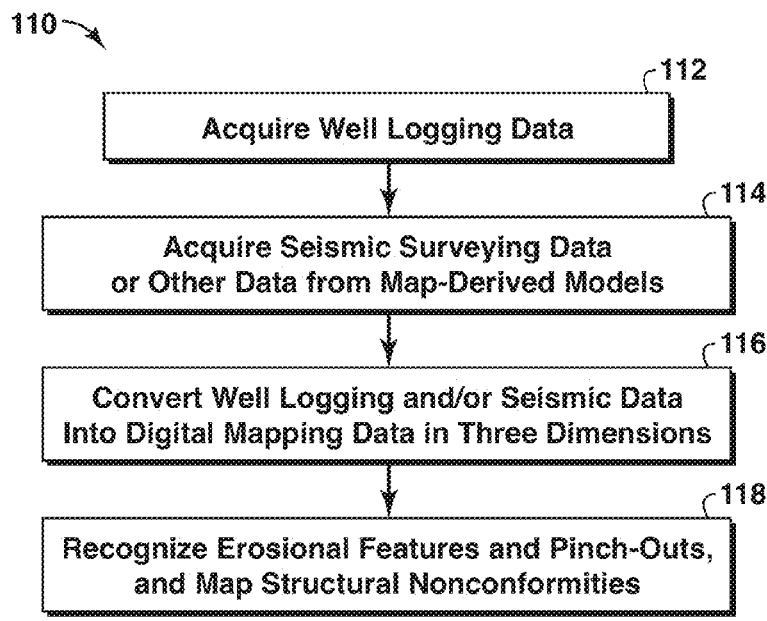
FIG. 2 is a flow diagram illustrating steps for establishing the geologic structure for the geomechanical modeling method of FIG. 1, in one embodiment.

Preferred steps for creating the geologic structure 110 are generally outlined in FIG. 2. FIG. 2 provides a flow diagram illustrating steps for establishing the geologic structure for the geomechanical modeling method of FIG. 1, in one embodiment.

As indicated in FIG. 2, the analyst may acquire well logging data. This step is shown at Box 112. One of ordinary skill in the art will understand that a well log relies upon a sensing device that is run down a wellbore, typically on a wire line. Well logs provide interpretative evidence as to the make-up of a formation as a function of depth. Examples of well logs that might be employed in step 112 to create the geological structure 110 include gamma ray logs, density logs, resistivity logs, porosity logs and sonic logs.

The analyst may also acquire data from "map-derived models." This is shown in Box 114 of FIG. 2. Map-derived models would typically include data that exists from field-wide surveys. Such surveys may include well logging data from wells around the field. However, such data primarily includes seismic surveys across an area under study. The seismic surveys would constitute a first seismic data set used in calculating time-lapse seismic timeshifts, discussed more fully below.

In the step of establishing the geologic structure 110, the analyst will take the well log and/or seismic data and convert it into a digital representation of a subsurface area. This is shown in Box 116 of FIG. 2. Preferably, the data from the seismic surveys and well logging data is input into a known geological gridding program. An example of such a program is FloGrid™ offered by GeoQuest of Houston, Tex. GeoQuest is the software division of Schlumberger Information Solutions (SIS), an operating unit of Schlumberger OilField Services. The FloGrid program is described in U.S. Pat. No. 6,106,561 which is incorporated herein by reference in its entirety.

FloGrid™ is most typically used as a "pre-processor" for reservoir analysis. FloGrid™ constructs fluid-flow simulation grids for use in a reservoir simulator such as Schlumberger's ECLIPSE™ program. Reservoir data such as the porosity and permeability of the rock matrix is loaded into the program, and a simulation grid or "mesh" is created for the reservoir simulator.

A reservoir simulator, in turn, creates a mathematical model of a reservoir. In operation, a designated reservoir volume is divided into a large number of interconnected cells. The average permeability, porosity and other rock properties are then estimated for each cell. The process makes use of data from well logs, seismic surveys, and rock cores recovered when wells are drilled. Production from the reservoir can then be mathematically modeled by numerically solving a system of three or more nonlinear, partial differential equations describing fluid flow in the reservoir.

In the method 100, the geological gridding program is being used as a map-based model for the geological structure 110. However, the map-based model will not be entered into a traditional reservoir simulator; rather, as will be described more fully below, the geological structure 110 created from the map-based model will be converted into a finite element model. In this way, the effects of changes in pore pressure on geomechanical stress can be modeled.

The grid that is created from the elements by FloGrid™ (and other known geological analysis software programs) is generally horizontal. This means that a two-dimensional map is created based upon the subsurface data that is loaded into the pre-processor. In other words, the data is used to create a two-dimensional representation of the production area under study at a selected depth. However, a multi-scale or three-dimensional grid is not automatically created.

It is known to create a three-dimensional map from a pre-processor program output by stacking a series of two-dimensional representations generated by the program. However, this is a manual process that tends to be very time-consuming. In practice, the analyst acquires logging data from various exploratory wells. Depth corrections may be made, and the well logs are then used to identify strata and perform depth correlations between wells. Subsurface structures or facies may then be mapped through a process of manually stacking layers.

An improved geomechanical modeling method is offered herein that automatically builds a three-dimensional map-based model from subsurface data, and then converts the map-based model into a finite-element-based model. To this end, the present method 100 employs, in one aspect, a modified pre-processor that includes an automatic stacking function. This means that the conversion step 116 automatically creates a three-dimensional model from the survey data without having to manually stack sequential horizontal layers.

The modified pre-processor developed for Box 116 can stratify the subsurface formation under study and map properties that are common to wells. Optionally, the modified pre-processor can also derive properties such as elastic constants in order to provide a mechanical description of the layered structure that has been upscaled from a two-dimensional model.

To prepare the three-dimensional model, the layer structure and layer properties are derived from the well logging data obtained in step 112 and the seismic survey data obtained in step 114. The data is correlated with depth, and then merged with the modified pre-processor software to create the geological structure 110. In this manner, a three-dimensional map is automatically created. The map includes data at various strata including, for example, porosity, permeability, temperature and pressure.

In order to provide the automatic three-dimensional conversion, an ASCII Data-to-ZMap programming function may be used. ASCII is an acronym for "American Standard Code for Information Interchange." This is a character encoding program based on the English alphabet. In general, ASCII is a seven-bit code, meaning it uses bit patterns represented with seven binary digits (a range of 0 to 127 decimal) to represent character information.

The character information is converted to a ZMap file format. "ZMap" is a name given to a particular industry file format having its own characteristic header information. Header information describes the size of the domain, that is, the min-x, the max-x, the min-y, and the max-y. This, in turn, is a reference to the offset from some global reference coordinate in a given plane or depth. The ZMap program provides a corresponding "z" coordinate value for each reference point within the plane. The "z" coordinate value corresponds to elevation or surface changes at the various locations within the plane. Thus, the ZMap format places the coordinate data in a particular format such that a description is provided in three dimensions, to with, "x," "y" and "z."

It is also noted that when a two-dimensional grid is created by FloGrid™ or other geological analysis software, the mesh is not only horizontal, but is also in the form of a very thin layer. When the collective thin layers of meshes are stacked under a known manual technique, the new three-dimensional mesh does not accurately recognize erosional features and pinch outs that may naturally exist in the reservoir. This is because in the usual oil reservoir simulation, the gridding program seeks to represent properties of the reservoir by using a mathematical function which gradually changes according to the position within the reservoir boundaries. However, it is difficult to force these functions to approximate changes in the properties which occur very abruptly as a result of geological features within the reservoir. For instance, a reservoir may have two distinct layers, each of which has a substantially different value for a given property (e.g., porosity) at the boundary between these two layers. A mathematical function representing the value of the properties might therefore have to make an immediate transition from one value to the other at the boundary between the layers. Therefore, in certain embodiments of the methods herein, the geomechanical model accounts for pinchouts and erosional features in the subsurface layers. This is indicated in FIG. 2 by Box 118.

Figure 3:
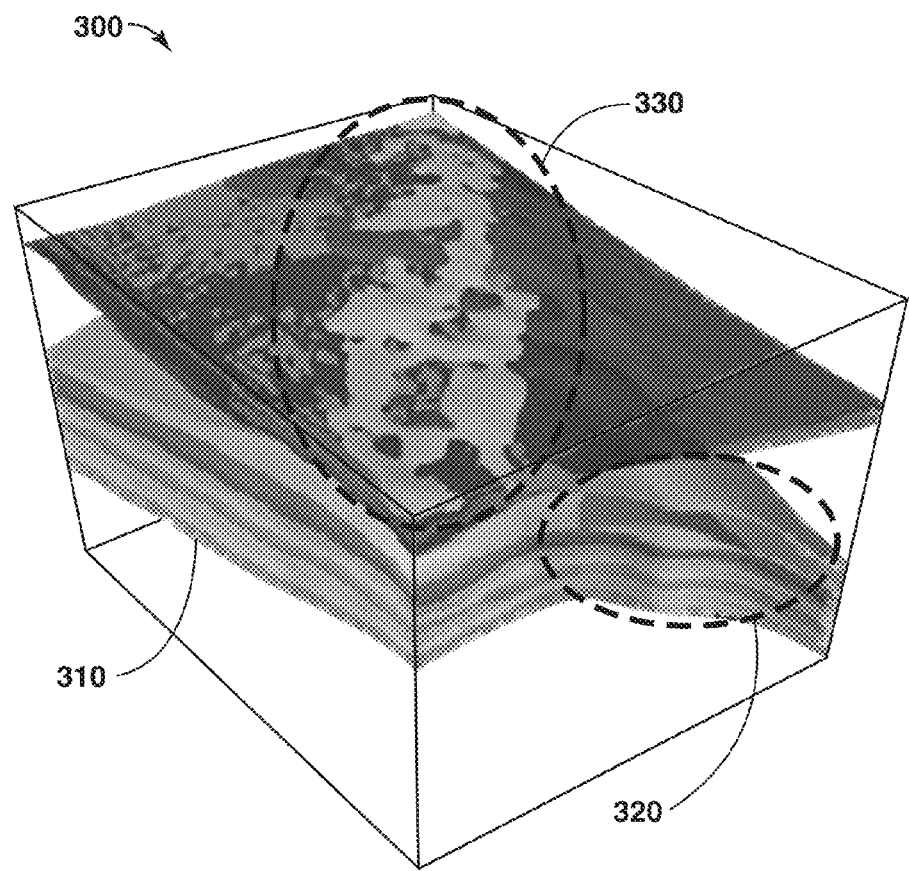
FIG. 3 is a sectional view of an illustrative oil reservoir which is being modeled. The oil reservoir is the product of survey data that has been taken from geologic structures and translated into stratigraphic layers. A series of stratigraphic layers is seen.

FIG. 3 is a cross-sectional view of an illustrative oil reservoir 300 which is being modeled. The oil reservoir 300 is the product of survey data that has been taken from geologic structures, and translated into stratigraphic layers 310 in accordance with steps 112-116. A series of stratigraphic layers 310 is seen in FIG. 3.

In FIG. 3, the layers 310 include an area of "pinchout" 320. In addition, the layers 310 include erosional features 330. Pinchouts and erosions, or vanishing layer thicknesses, may arise from tectonic forces within the earth and from erosion. The presence of pinchouts 320 and erosive zones 330 makes it more difficult for an analyst to develop a numerically tractable geomechanical model for field-wide computer simulation. Indeed, correcting numerical singularities with human interactions, even aided by existing CAD (computer aided design) tools, can be prohibitively time consuming for generating accurate computer models. Therefore, an optional aspect of the geomechanical modeling method 100 is to recognize erosional features and pinch outs and to map such structural nonconformities as done in FIG. 3.

To take into account structural nonconformities, a process has been developed to sort through the depth of the geologic structures and to identify geologic singularities such as pinchouts 320 and erosion features 330. Once such features 320, 330 are identified, correct depth ordering is restored. In addition, using the modified pre-processor, regions of zero thickness are assigned with a positive volume along with flow and structural properties that approximate the singular features.

In order to identify geological nonconformities, the modified pre-processor checks the nodes created from the map-based geological model 110. Checks are conducted at incremental locations to determine whether the depth represents an increasing order. If the order is non-increasing, this indicates that some of the nodes penetrate to other layers. This signifies a an erosive zone. On the other hand, if there are nodes having the same depth, this indicates a collapse. This, in turn, signifies a pinchout. When either of these conditions is determined, the elements have a zero thickness. To correct for the nonconformity, the element is given a positive thickness. This provides for volume.

In operation, the modified pre-processor interpolates points in the ZMap format from the map-derived model in order to provide additional data points for building the three-dimensional structure 110. The Z-map file produces collapsed nodes where unconformities, pinch-outs and erosive zones occur. As discussed further below, positive volume is accorded to these collapsed nodes to correct for unconformities, pinch-outs and erosive zones.

In order to create a mesh acceptable for finite element analysis (discussed below in connection with Box 120), the pre-processor should scan all nodes in the x- and y-directions through the depth of the geomechanical system to identify these nodes. When these singular nodes are identified, an appreciable pinch-out relief distance is given to create elements of positive volume. Stated another way, the pre-processor separates the nodes by a given thickness in the vertical direction between two nodes. This process is repeated until all the nodes are separated from each other. Consequently, all elements are assigned a positive volume.

It is noted that the mesh, or map-based model, that is generated from the modified pre-processor represents data that resides in a digital domain. In other words, as a result of establishing the geologic structure 110, a subsurface structure is mapped and descretized in a particular domain. That domain has certain local coordinates within the domain. Boundaries are provided at the outer edges of the domain. The boundaries are defined by certain parameters referred to as boundary conditions. Such parameters for an oil reservoir simulation may include the formation pressure and temperature history. This information is generated from the subsurface data acquired in the steps 112 and 114. This information may also be obtained from other reservoir flow simulations. Such information may be adopted as sets of boundary conditions for the geologic structure 110.

It is desirable to represent the local coordinates and boundary conditions in the geological structure 110 in terms of nodes within a finite element analysis domain. In this way, geomechanical modeling can be conducted. Thus, referring back to FIG. 1, a next step in the modeling method 100 is the creation of a finite element mesh. This step is illustrated at Box 120. The purpose of step 120 is to take the grid representing the geologic structure 110 (a map-based model) and convert it into a mesh 120 for finite element analysis.

Finite element analysis involves the representation of individual, finite elements of a geological system in a mathematical model. A predetermined set of boundary conditions is provided for the geological system. Changes to the geological system are predicted as a solution to the mathematical model as fluid pressures change within the system.

In finite element modeling, the region that is to be analyzed is broken up into sub-regions called elements. The process of dividing a production area under study into sub-regions may be referred to as "discretization" or "mesh generation." A mesh is a collection of elements that fill a space, with the elements being representative of a system which resides in that space. The region that is to be analyzed is represented by functions defined over each element. This generates a number of local functions that are less complicated than those which would be required to represent the entire region.

Figure 4:
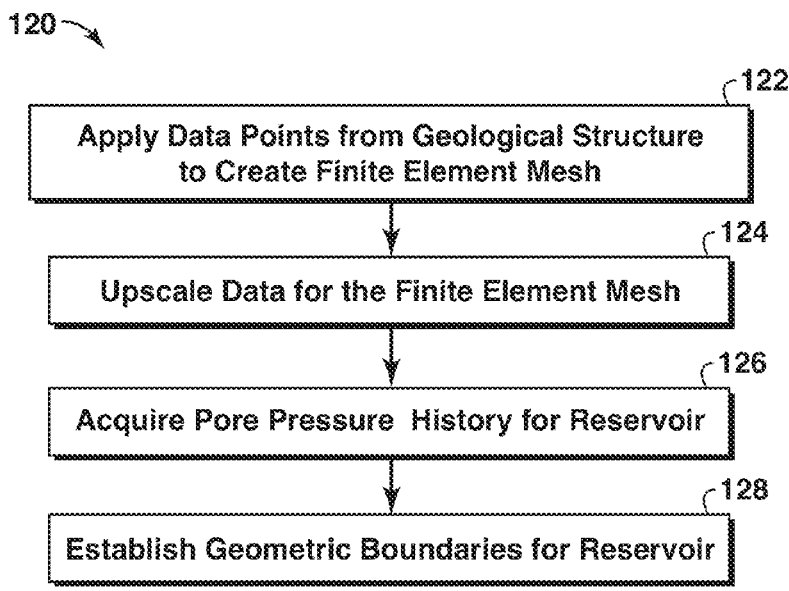
FIG. 4 is a flow diagram illustrating steps for creating a geomechanics finite element mesh from the geomechanical modeling method of FIG. 1, in one embodiment.

FIG. 4 presents procedures in connection with step 120. Under step 120, a geomechanics finite element mesh is created. In order to create the finite element mesh 120, data points are taken from the geologic structure 110, and then input into a utility program. This is shown at Box 122 of FIG. 4.

In creating the new mesh 120, the production history is first considered. The production history, which includes pressure and temperature mapping, is carried out using a weighting algorithm. The weighting algorithm relies upon search volumes. Preferably, the search volumes are ellipsoids. This means that a search ellipsoid is defined around each node. Ellipsoids (such as in the shape of a football) are preferred because the reservoir thickness is small compared to the other two dimensions. This gives the user the flexibility to approximate most volumes by adjusting its semi-axes. For example, the ellipsoid equation may be modified to a plane domain by assigning larger semi-axes in the in-plane directions, and smaller values in the thickness direction. However, it is understood that other search volumes such as cylinders may be used as part of the algorithm.

The algorithm uses a distance-space weighted function to find a base value to represent the pore pressure (or other reservoir characteristic) in the geomechanical model. In other words, the weighting scheme is based on distance between the geomechanical node and the reservoir analysis node. In the preferred embodiment, a three-dimensional weighting scheme is formulated whereby nodal quantities for the geomechanical simulation 110 are mapped from a spatial neighborhood of reservoir simulation gridpoint quantities. The reservoir simulation gridpoints are known for their pressure and temperature from the pre-solved reservoir analysis.

In operation, the weighting scheme calculates the nodal quantity "p(r)" in the geomechanical model based on the nodal quantity "$P_i$" from the reservoir analysis gridpoints through the following equation, $$p(r) = \frac{\sum_i w_i P_i}{\sum_i w_i}$$

in which $$\frac{1}{w_i} = \frac{(r_x - \xi_x)^n}{a^n} + \frac{(r_y - \xi_y)^n}{b^n} + \frac{(r_z - \xi_y)^n}{c^n}$$

wherein: r is the position vector of a geomechanical node;
$r_x$, $r_y$, and $r_z$ are the "x," "y", and "z" position vectors of the reservoir analysis nodal position vectors, respectively;

P is a nodal quantity for a property at reservoir analysis gridpoints;

p is a nodal quantity for a property in the geomechanical model;

a, b, and c are the semi-axes of the three principal directions of a searching ellipsoidal domain in the "x","y", and "z" directions, respectively;

$\zeta$ is the reservoir analysis nodal position vector;

$\zeta_x$, $\zeta_y$, and $\zeta_z$ are the "x" "y", and "z" components of reservoir analysis nodal position vectors, respectively;

n is the exponent of weighting; and $w_i$ is the distance based weight.

The reservoir characteristic is mapped based on the property "P" (e.g. pressure or temperature) of the surrounding reservoir analysis gridpoints inside the searching ellipsoid.

It should be noted that in many cases, the volume of data used in a geologic model is much greater than what is needed or desired in creating a finite element model. Therefore, one optional aspect to the step 120 is "upscaling" or reducing the amount of data while maintaining an accurate mathematical description. This is shown in Box 124. Upscaling is an integral feature to most gridding programs, including FloGrid™.

The purpose for creating the finite element mesh 120 is to determine movement of the rock matrix within the reservoir under study in response to changes in fluid pressure. In addition, movement of the rock matrix within the reservoir in response to changes in temperature may be determined. Finite element analysis allows the analyst to determine the response of the "elements" to changes in the geomechanical system. In order to meet this purpose, the pore pressure and, optionally, the temperature within the reservoir are initialized at various points. In practice, information concerning pore pressure history inside the reservoir is acquired. The step of acquiring historical pore pressure data is indicated in Box 126.

The known points of data for pore pressure are referred to as "nodes." Each of the nodes is mathematically provided with one or more degrees of freedom. This is part of the "discretization" or "mesh generation" process. The degrees of freedom represent permitted movements in the rock in response to changes in fluid pressure during production or injection. These may also be referred to as "Gaussian integration points." A mathematical approach is taken to describe how each point or node displaces relative to each node for a given initialized state.

In addition, the reservoir has physical boundaries. Boundaries are provided at the outer edges of the domain. These are referred to herein as geometric boundaries. The step of establishing boundaries for the geomechanical model is indicated at step 128. The step 128 of establishing boundaries involves determining the geographic extent of the strata under study. This includes both the aerial dimensions and the depth.

The boundaries have known (or approximated) pore pressure values and geomechanical properties. The pore pressure, displacement, and geomechanical values at the geometric boundaries represent the "boundary conditions."

A next step in the geomechanical modeling method 100 is the input of rock material properties into the finite element mesh 120. Rock material properties refers to the lithology of the rock as well as its permeability, its porosity, its elasticity, and other features. The step of inputting rock material properties is shown at Box 130 of FIG. 1.

A variety of tools may be used to acquire information concerning rock material properties. One source of data is core test data. Core test data refers to data taken from core samples. This may include rock lithology, porosity, and permeability. Various tests may be run on core samples in order to acquire this information. Core samples are considered the most useful source of rock data since they provide tangible and physical information concerning the make-up of subsurface rock formations at given depths.

Loading tests may also be performed in order to determine the rock's elastic properties. Typical tests include cyclic conventional geomechanics tests, uniaxial tests, or triaxial tests. The tests may be performed on the core samples in both drained and un-drained conditions, that is, in both dry and saturated conditions. For example, a sample may be taken to failure under load to determine failure properties so as to map the rock in a Mohr Coulomb or Drucker-Prager analysis. Such analyses may provide Young's modulus, Poisson's ratio, Lame' constants, rock density and other rock properties that may be calculated according to formulae known by those skilled in the art of geomechanics. Other "critical state" models such as the Cam-clay model are known and may also be used. In any instance, the rock material/property model 130 is constructed using either elastic or elastoplastic models based on the analyst's judgment.

In connection with an evaluation of geomechanical stresses and failure criteria, it is generally recognized that rocks are strong in compression but weak in tension. This is particularly true for rocks with natural fractures. For these rocks, compressive stresses will tend to leave fractures closed, but tensile stresses will open the rock and encourage fracture growth. By this criterion, any portion of a rock subjected to tensile stress is likely to fail. Tensile stresses may come into play in an overburden where fluid is removed from a subsurface formation.

In practice, failure points are determined by breaking core samples in compression under different confining pressures. The uniaxial and triaxial compression laboratory test procedures and calculations used to define the failure line in a Mohr-Coulomb analysis are known to those of ordinary skill in the art of geomechanics. When considering porous rocks with an internal pore fluid under pressure, the stresses correspond to "effective stresses." The "effective stress" on a porous rock is the normal total stress minus the pore fluid pressure. The concept of "effective stress" and its use is also known to those skilled in the art.

Well log data is also used to assess rock material properties. Data derived from well logs may inform as to both rock makeup and elastic properties. For example, gamma ray logs and density logs are useful in determining the amount of shale in a rock, which infers the presence of clay. Sonic logs can be used to calculate elastic properties. Porosity logs may also be used for porosity determinations.

It is noted that the geomechanical modeling method 100 may employ constitutive models when analyzing rock properties 130. A constitutive model takes into account the fact that certain properties normally considered to be constant, such as porosity, may change in response to other factors such as stress or strain or temperature. Constitutive behavior represents a modeling framework which captures the evolution of a particular material property over time. The constitutive model provides a mathematical model that describes how those properties evolve as a function of some other parameter, usually in time.

In the context of the utility program for the finite element mesh 120, the constitutive model may be prepared by assigning the Young's modulus, Poisson's ratio, initial yield stress, friction angle, plastic hardening curve, or other factors compiled from laboratory core test results. The selected values are assigned to the finite element mesh.

For a formation under geomechanical study, the formation thickness is also an important parameter. The initial thicknesses of rock layers may be determined through both well log data and seismic data. The thickness of the formation may change in response to depletion-induced changes in the stress and strain fields, changes in temperature, or other factors.

Geomaterials also exhibit pressure-dependence. Therefore, the mathematical framework of the finite element mesh also takes into account the failure mode of the rock. For example, if the rock is elastic it is generally going to reform back to its original shape in response to stress. However, if the rock is plastic it is more likely to shear in response to stress. The failure mode may also take into account whether a particular rock may shear under compression, or form shear bands. The response of a rock matrix may be calibrated with laboratory tests to determine response for plastic behavior or nonlinear elastic behavior. The failure mode may be analyzed mathematically using geomechanical properties, such as the Mohr-Coulomb/Drucker Prager failure criteria.

As noted above, a utility computer program is offered which incorporates repair capabilities to convert the geologic structure 110 into the finite element geomechanical model 120. Two constitutive material models are preferably given to these two layers. In this respect, the layers may either be described as being in a plastic regime or an elastic regime. The governing equation then incorporates these two material models into sets of equations to be solved. The compatibility and force (flux) equilibrium will be satisfied as the equations are solved.

Rock material and geometric properties are also processed to calculate the initial velocities of seismic waves $v_i$ through the rock layers. Seismic waves include "P" waves and "S" waves. "P" wave velocity may be indicated as "$v_p$", while "S" wave velocity may be designated as "$v_s$."

A next step in the geomechanical modeling method 100 is geostatic initialization. This step is indicated at Box 140. The purpose of this step 140 is to initialize the geomechanical condition of the formation at issue.

As part of the geomechanical initialization step 140, the geomechanical stresses assumed for the production area under study may need to be adjusted. For example, the model may need to be adjusted to reflect in situ tectonic forces acting upwardly from below the production area under study. Alternatively, the model may need to be adjusted to reflect in situ tectonic forces acting from one side of the production area under study. Alternatively still, the model may need to be adjusted to reflect overburden acting downwardly on the production area under study. In this way, initial stresses on the production area are more accurately characterized.

In the present method of geomechanical modeling 100, the external stresses, be they under-, over-, or side-burden, may be generated through a process of extrapolation. This means that information from inside of the domain or production area under study 120 is extrapolated to outside of the domain. This is done by using the geomechanical model that incorporates the weight of each individual layer including under- or over- or side-burden, the hydrostatic load on the surface of the overburden and far field boundary conditions to reach a "geo-static" equilibrium under several iterations. A "geo-static equilibrium" means the model carries some initial stress where the model yields non-appreciable displacements before any human interference.

Alternatively, external stress data may be obtained from an interpolation of neighboring fields and/or neighboring wells. This means that far-field boundary conditions are considered, and then the data is "filled in" for the production area under study. This may be done, for example, by leak off tests from downhole measurements.

In some instances, the production area under study may be too close to a model boundary. When this occurs, it may be desirable to expand the domain by adding a side-burden. This is done by extending the boundary of the model by adding side-burden to the original model. Preferably, the side-burden is at least three times larger than the original model.

The geomechanical initialization step 140 relies upon a variety of information that is mathematically incorporated into the utility program of the mesh 120. This information may come from well log data, drilling records, and/or initial well test data. The initial stress state is calculated and calibrated based on the acquired information. Optionally, far-field boundary conditions are imposed on the created geomechanical system. Exemplary systems and methods suitable for the geomechanical initialization step 140 may be found in corresponding U.S. Application 61/106,787, entitled, "Method for Modeling Deformation in Subsurface Strata," which is incorporated herein by reference for all purposes.

Figure 6:
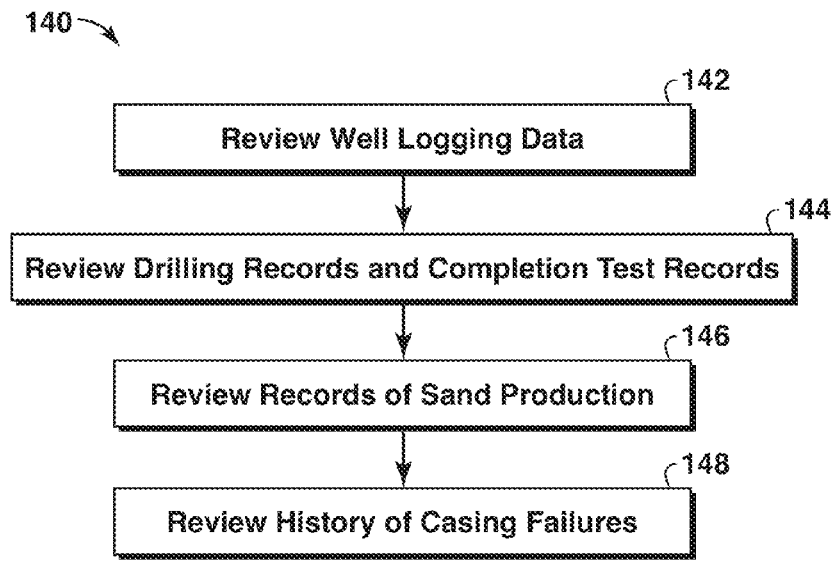
FIG. 6 is a flow diagram illustrating steps for initializing the geostatic condition of the geomechanical modeling method of FIG. 1, in one embodiment.

FIG. 6 provides a flow chart that outlines data considered in connection with the geomechanical initialization step 140. First, various well logging data may be used. This is shown at Box 142. Examples of well logs that may be consulted include density logs, FMI logs and caliper logs.

Density logs inform the analyst as to the density of the formation under study. This is useful as it is used to distinguish the producing and non-producing layers.

FMI logs, or "formation microimaging" logs, detect fractures within the formation. Such fractures may either be naturally occurring fractures, or may be induced by fluid pressures inherent in the drilling process. FMI logs are instructive as they indicate the strength of the rock formation.

Finally, the caliper log measures the radius of a wellbore as a function of depth. The caliper log can provide an indication of washouts, borehole collapse, or other drilling-induced variations in radius. This also may be indicative of rock strength.

Next, the analyst may consider drilling records and completion test records. This is shown at Box 144. Drilling records may record instances of fluid loss or "lost returns" during wellbore formation. This, in turn, is also indicative of formation strength. In some instances, leak-off tests are performed during the drilling process in order to intentionally step right up to the fracture gradient of the formation at selected depths. The analyst may use this information to more accurately characterize pressures and stresses.

Records of sand production within the development area may also be instructive. This is shown at Box 146. In this respect, the presence of sand production from a certain depth informs the analyst about the mechanical characteristics of the formation, particularly at the face of the formation. For example, the presence of sand in the production fluids is an indication of the cementation strength of the formation. This, in turn, may assist in calibrating failure criteria.

Information concerning the history of casing failures in the development area would also be highly useful. This is shown at Box 148. If casing failures have occurred, this probably is evidence of formation shear occurring in the region as a result of subsidence or heave. This would suggest potentially weak facies. For example, a formation comprised of bentonite or other depositional phase material might not show up in the log data. Bentonite is considered to have a low internal friction or low cementation, meaning that it is weak. Bentonite and shale formations are considered to be strong in compression but weak in shear.

A next step in the geomechanical modeling method 100 is actually running the program. This step is indicated in FIG. 1 at Box 150. In order to run the utility program, the data is input into a simulator or "solver." A solver is a program that is able to solve the governing equations of interest. In geomechanics, the solver finds the solution that satisfies force equilibrium, compatibility and constitutive laws. In one aspect, the program is an available geomechanics software program such as ABAQUS™.

Because the mesh lies within a producing zone, the pore pressure within the mesh or inside the "producing mesh domain" will change as a function of time. Using the finite element analysis mesh 120, as the pressure changes, stresses acting inside of the mesh may be predicted. Such stresses may include a compaction strain ($\epsilon_{3-3}$) and out-of-plane shear strains ($\gamma_{1-3}, \gamma_{2-3}$).

Figure 5:
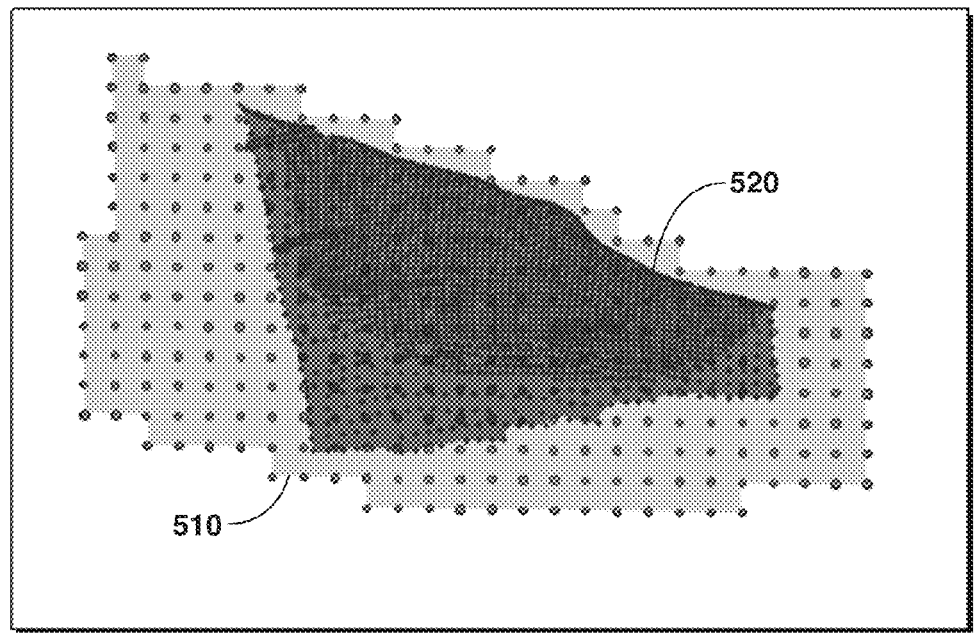
FIG. 5 indicates operation of two reservoir flow simulators. The first is a series of ABAQUS-modeled nodes set out in a uniform grid. This is from a finite-element analysis. The second is a map-based mesh.

FIG. 5 indicates the operation of the utility program and the subsequent ABAQUS simulator. Two reservoir flow simulator grids 510, 520 are shown. Simulator 520 represents the reservoir model grid blocks or gridpoints from the finite element mesh 120. The other simulator 510 is a series of ABAQUS-modeled nodes. The ABAQUS™ simulator sets out the nodes from the reservoir simulator into a more uniform grid.

To solve for earth stress changes, a matrix is created within the physical boundaries. The matrix defines the properties of the various elements within the physical boundaries. The matrix includes a vector that defines the forces acting on each element in the structure. Once all the element matrices and vectors have been created, they are combined into a structure matrix equation. The structure matrix equation relates nodal responses for the entire structure to nodal forces.

After applying boundary conditions, the structure matrix equation is solved to obtain unknown nodal responses. Intra-element responses can be interpolated from nodal values using the functions which were defined over each element. Such interpolation is done through the utility program.

It is noted that commercially available reservoir flow simulators such as ECLIPSE™ only predict pressure and temperature changes within the reservoir. Such simulators lack the capability to solve for earth stress changes within and outside the reservoir. However, a separate solver such as ABAQUS™ allows the simulator to solve for the earth stress changes. Again, these may represent a compaction strain ($\epsilon_{3-3}$) and out-of-plane shear strains ($\gamma_{1-3}, \gamma_{2-3}$).

In the creation of the geomechanical model 120, the model may represent a large area, for example, up to 100 miles by 100 miles. Within this model 120, a series of elements that are, for example, a half mile by a half mile in area may be created. However, it may be desirable for the analyst to inspect or understand the geomechanical condition of a smaller area within an individual element. Accordingly, a submodeling technique has been developed that allows the analyst to more accurately characterize a smaller portion or domain of a production area under study. Stated another way, submodeling means the ability to analyze or "zoom in" on a smaller domain within the overall production area.

The submodel defines a complimentary finite-element-based submodel having increasing levels of refinement from the finite element mesh. By increasing the level of refinement, the resolution is improved due to the smaller domain and the presence of additional elements employed in the submodel. It is understood that it is not practical to have small element sizes of, perhaps, several feet when the region of interest is in excess of, perhaps, 100 or more miles. By progressive transition from a larger global model to a smaller submodel, the program can more accurately solve the physical variables of interest.

As noted, the overall model 120 is defined by the boundary conditions established in the program (steps 120, 130 and 140). Such boundary conditions may include a distributed load representing the weight of the overburden. The boundary conditions may also include the internal pressure and temperature boundary conditions as a function of depth. From there, submodeling of the production area under study may be applied.

The submodeling takes into consideration the production history within the reservoir. This includes drawdown information, depletion history, historical production rates, individual well tests, and post-completion well logs. The submodeling may also take into consideration casing failures that may have occurred within the field under study. As will be described further below, well failure history is also analyzed as part of a predictive model 1000.

In order to create the submodel, the operator identifies a region of interest. Then appropriate submodel boundaries are defined. The submodel is assigned a more descretized mesh to obtain better resolution of physical properties. This process could be repeated for several levels, meaning that two, three, four or "n" number of size domains may be consecutively analyzed to allow the operator to zoom in to a point within the reservoir model. For example, the operator may move from a global level that is 100 miles×100 miles, to several intermediate submodels that are 1 mile×1 mile, and finally to a near well bore level that is 1 foot×1 foot. The benefit is that strain values ($\gamma_{1-3}, \gamma_{2-3}$) may now be determined at nodal points in the finite element mesh.

Figure 7:
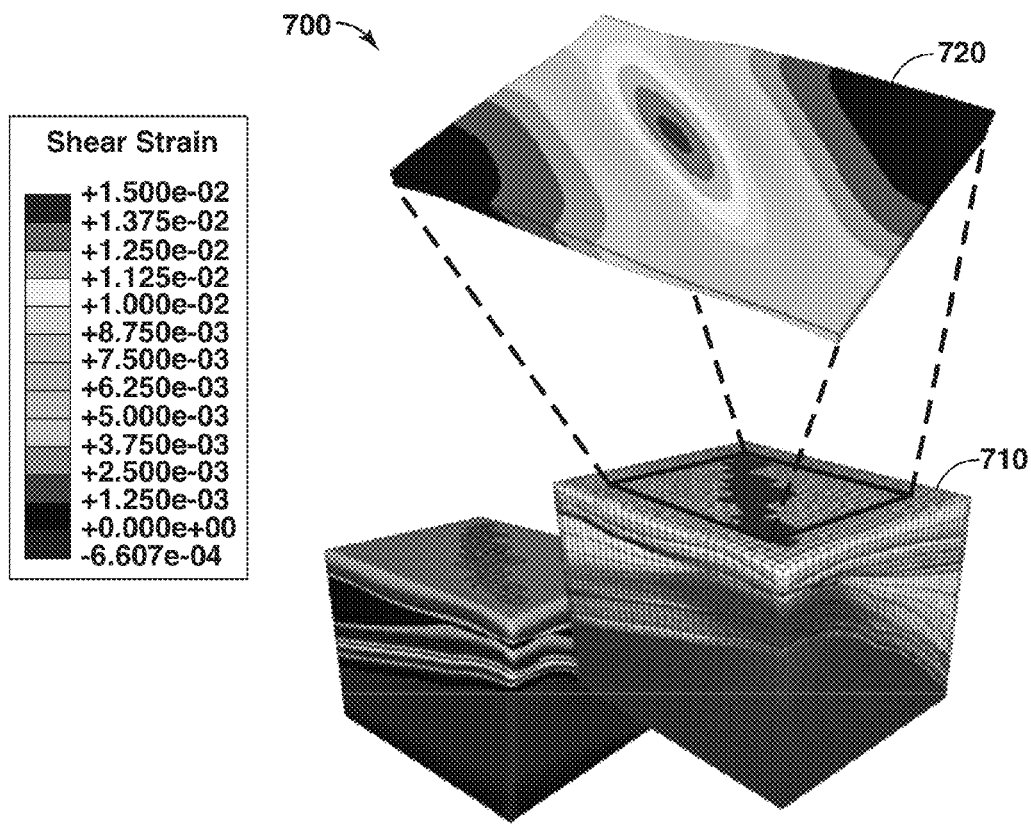
FIG. 7 presents a sectional view of a global model and submodel of a geomechanical model without nonconformities. The inset of FIG. 7 shows the contour of effective shear strain of a submodel caused by in-situ stress changes from production.

FIG. 7 presents a sectional view of a global model 700. The model 700 demonstrates a formation 710 under study. In this illustrative embodiment, the formation 710 is without nonconformities.

In FIG. 7, an inset 720 is shown. The inset 720 demonstrates the contour of effective shear strain caused by in-situ stress changes from production. The inset 720 of FIG. 7 shows the contour of effective shear strain of a submodel caused by the in situ stress changes from production. The contour plots shows region of high shear strain acting within a formation. Thus, one result of running the geomechanical simulation model 100 is the ability to determine shear strain forces acting within the formation in response to changes in pore pressure.

Finally, a step in the modeling method 100 may be consistency analysis. This step is shown at Box 160. The purpose for the consistency analysis 160 is to provide a peer review of the results. This, in turn, enhances the accuracy of the modeling method 100.

The peer review may be a human peer review. In this instance, a human peer will exercise his or her engineering mechanics judgment and geomechanics modeling experience to confirm that the results of the simulation 100 are reasonable or acceptable. This step 160 is a subjective review as opposed to simply manipulating data. However, in some cases, the peer review may be conducted through a separate program.

Figure 8:
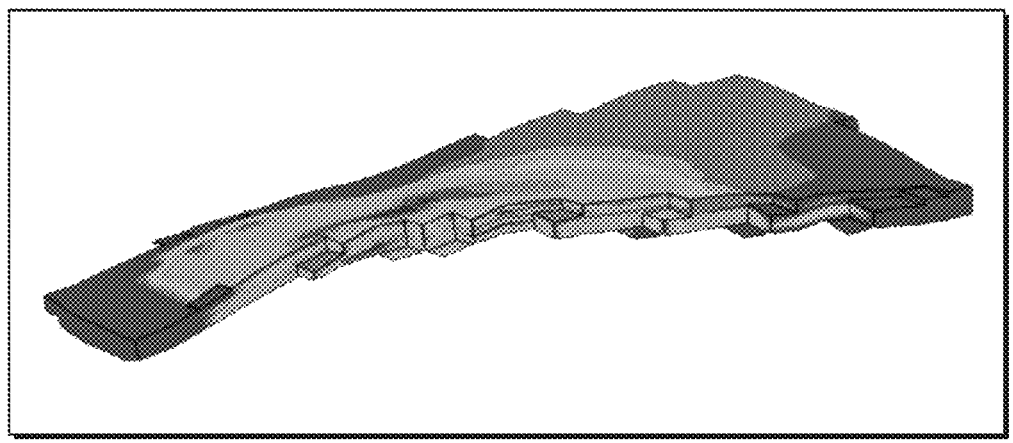
FIG. 8 is a pressure contour plot mapped from a geomechanical modeling simulation.

To demonstrate operation of the method 100, FIG. 8 is provided. FIG. 8 is a pressure contour plot mapped from a reservoir simulation. In this simulation, the exponent of weighting ("n") equals 2. A multi-scale geomechanical simulation is implemented based on an assumed production history. It is noted that a region of high depletion will result in a reduction of pore pressure. This, in turn, will yield higher compaction within the reservoir, potentially leading to changes in rock layer thicknesses.

Figure 9A:
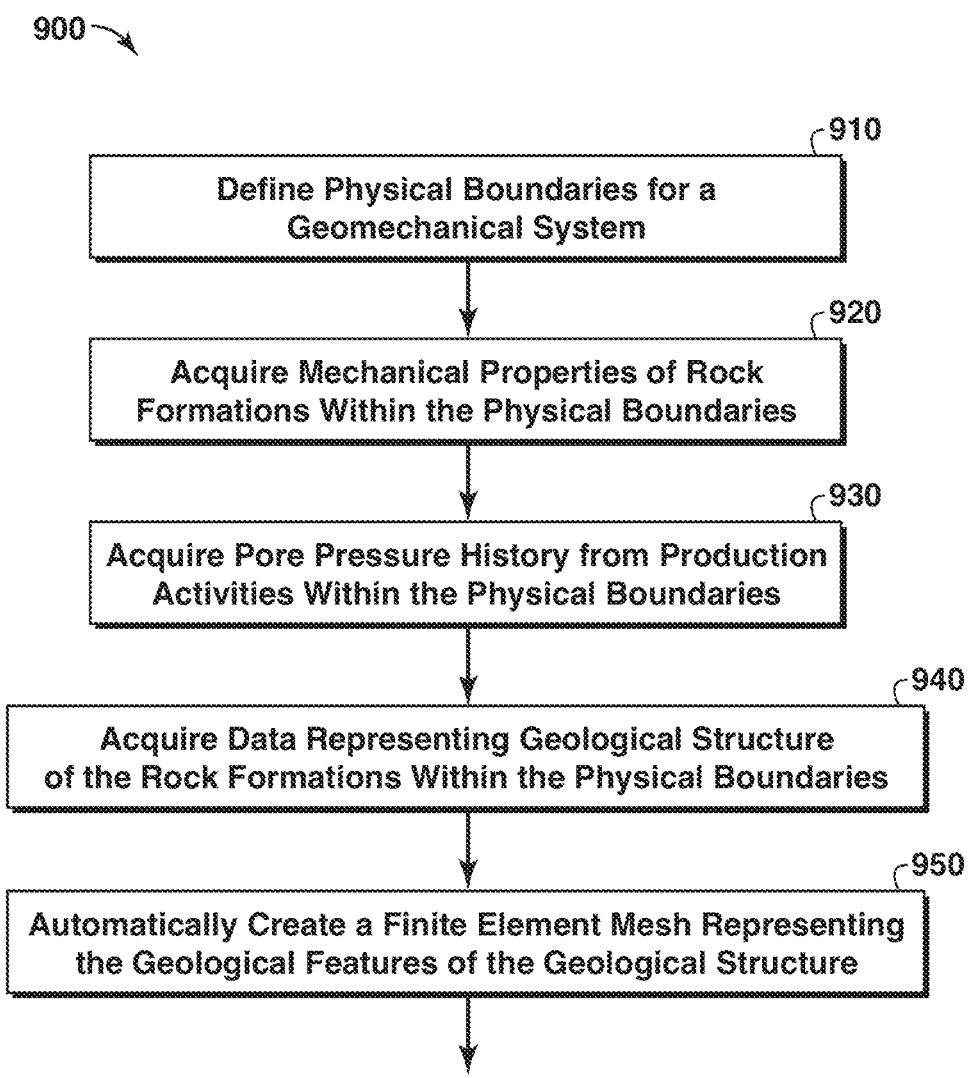
FIGS. 9A and 9B present a single flow chart showing steps that may be taken to run a reservoir simulation model in accordance with one embodiment of the present invention.
Figure 9B:
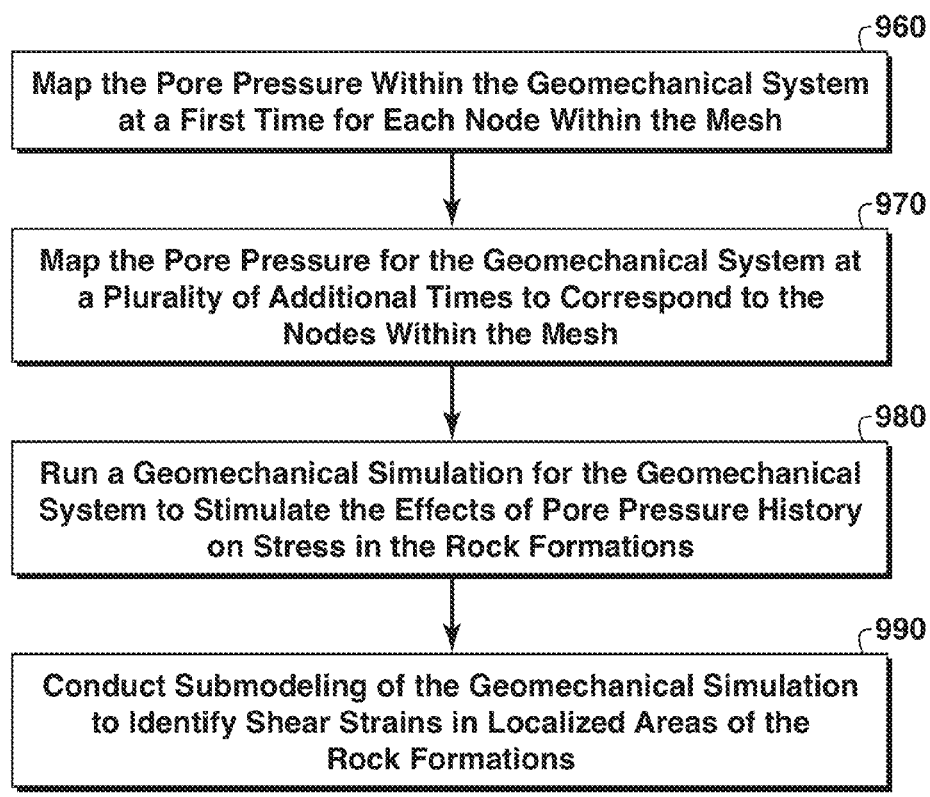

In order to use the geomechanical modeling method 100 to perform reservoir simulation, a series of steps may be taken. FIGS. 9A and 9B together present steps which, in one embodiment, provide a reservoir simulation method 900. The purpose of the method 900 is to evaluate whether changes in reservoir pressure as a result of production activities will affect formation stability and formation thickness. Such production activities may be withdrawal of reservoir fluids from a reservoir, injection of fluids into a reservoir under study, or a combination thereof.

The method 900 may be generally characterized as a computer-implemented method for modeling a geomechanical system. In one aspect, the method 900 first includes defining physical or "geometric" boundaries for the geomechanical system. This step is indicated at Box 910 of FIG. 9A. The step of Box 910 is consistent with Box 128 of FIG. 4, described above.

The method 900 also includes acquiring mechanical properties of rock formations within the physical boundaries. This step is indicated at Box 920 of FIG. 9A. The step of Box 920 is consistent with Box 130 of FIG. 1, described above.

The method 900 also includes acquiring pore pressure history from production activities within the physical boundaries. This step is indicated at Box 930 of FIG. 9A. The step of Box 930 is consistent with Box 126 of FIG. 4, described above. Acquiring pore pressure history 930 may optionally include acquiring other reservoir characteristics such as temperature history, porosity or permeability.

The method 900 also includes acquiring data representing geological structure of the rock formations within the physical boundaries. This step is indicated at Box 940 of FIG. 9A. The step of Box 940 is consistent with Boxes 112 and 114 of FIG. 2, described above. The step 940 may be part of the preparation of a map-based geological model.

The method 900 also includes automatically creating a finite element mesh representing the geological features of the geomechanical system. This step is indicated at Box 950 of FIG. 9A. The step of Box 950 is consistent with Boxes 122 and 124 of FIG. 4, described above. In this respect, step 950 may be the derivation of a finite-element based geological model from a map-based geological grid.

The mesh defines a plurality of nodes representing points in space. Each of the points has potential displacement in more than one direction, meaning more than one degree of freedom. Such displacement may be translational in an "x," a "y," or a "z" direction. Such displacement may also optionally be rotational about a plane in the "x" direction, a plane in the "y" direction, and/or a plane in the "z" direction.

It is preferred that the mesh provide a positive value for any rock formations indicated from the data representing the geological structure to have a zero thickness. The purpose is to create volume for that rock formation. In this way, the repair of singular geologic entities such as "pinchouts" and erosional features is automated. The geological structure may be converted into a finite element mesh using a utility program that is compatible with a finite element analysis solver such as ABAQUS™.

The method 900 also includes mapping the pore pressure within the geomechanical system at a first time for nodes within the mesh. This step is indicated at Box 960 of FIG. 9B. The step of Box 960 is different from the step of Box 930, in that the pore pressure history acquired in step 930 is now being loaded into the utility program at the first time.

The method 900 also includes mapping the pore pressure for the geomechanical system at a plurality of additional times to correspond to the nodes within the mesh. This step is indicated at Box 970 of FIG. 9B. This means that the pore pressure history acquired in step 930 is now being loaded into the utility program at a plurality of additional times.

The method 900 includes running the reservoir simulation for the geomechanical system to simulate the effects of pore pressure history on stress in the rock formations. This step is indicated at Box 980 of FIG. 9B. The step of Box 980 is consistent with Box 150 of FIG. 1, described above. The effects may be mathematically quantified in the form of compaction strain values ($\epsilon_{3\text{-}3}$) and out-of-plane shear strain values ($\gamma_{1\text{-}3}$, $\gamma_{2\text{-}3}$) at selected locations within the geomechanical system. Preferably, the out-of-plane coordinates are transverse to the compaction strain coordinate.

Finally, the method 900 optionally includes submodeling in order to determine shear strains acting at a more defined point within the formation. This step is indicated at Box 990 of FIG. 9B. In order to create the submodel, the operator identifies a region of interest. Then, appropriate submodel boundaries are defined. This step 990 may be repeated for several levels, meaning that two, three, four or "n" number of size domains may be consecutively analyzed to allow the operator to zoom in to a point within the reservoir model. For example, the operator may move from a global level that is 100 miles×100 miles, to several intermediate submodels that are 1 mile×1 mile, and finally to a near well bore level that is 1 foot×1 foot. In this way, compaction strain ($\epsilon_{3\text{-}3}$) and out-of-plane shear strains ($\gamma_{1\text{-}3}$, $\gamma_{2\text{-}3}$) acting upon a wellbore for a specific well may be determined.

The geomechanical model 900 may also be used to predict changes in seismic wave velocity within individual rock layers. Such changes create what are known as time-lapse seismic timeshifts. "Time-lapse seismic timeshifts" refers to a change in the arrival time of seismic reflection waves following a period of depletion or injection in a production development area. Timeshifts are indicative of changes in thickness with respect to rock layers. Changes in rock layer thicknesses, in turn, can be used to infer changes in in situ fluid saturation and pressure.

Reservoir engineers understand that in situ pore pressure assists the rock media in supporting rock layers in the overburden. Thus, as fluids are produced, compaction of rock layers may occur in the formation. Reciprocally, dilation may occur in rock layers above the formation under production. Compaction and dilation of rock layers result in changes in rock layer thickness. Information concerning such changes is helpful to the reservoir analyst to determine the extent of depletion of fluids from or the extent of injection of fluids into a subsurface formation.

Timeshifts, or changes in arrival time of seismic waves, may also be caused by changes in mechanical properties within the subsurface rock layers. As fluids are produced from a formation, the pore pressure and temperature within the formation will change. Reductions in pore pressure and temperature may affect the geomechanical state of rock layers within and above the formation. Changes in geomechanical state, in turn, affect the velocities $v_p$, $v_s$ of seismic waves within the rock layers.

Attempts have been made in the petroleum industry to use computer-based models to correlate changes in time-lapse seismic timeshifts to changes in rock layer thicknesses. Such a model relies upon calculations of sound wave velocity that are based on various rock properties. Such rock properties include rock density and elasticity constants (such as Young's modulus, shear modulus, and Lame' constant).

It has also been proposed to adjust the velocity of sound waves in a computer model based on anticipated changes in the geomechanical state of the rock layers. In this respect, a relationship exists between changes in compaction strain (and accompanying rock density) and sound wave velocity. However, known models rely upon empirically determined "constants" to relate velocity reduction with compaction strain. These constants are determined through empirical calibrations that seek to retroactively match "constants" with measured seismic timeshifts. An example of the use of constants to adjust sound wave velocity in response to changes in compaction strain is provided in See P. Schutjens, *On the Stress Change in Overburden Resulting from Reservoir Compaction: Observations From Two Computer Models and Implications for 4D Seismic*, The Leading Edge, pp. 628-634 (May 2007), the disclosure of which is incorporated herein by reference in its entirety.

Unfortunately, empirical constants such as those proposed by Schutjens are not always accurate, particularly when the rock layers transform from an elastic regime into a plastic regime. In other words, the constants are not really constant. The inventors have recognized that seismic waves passing through rocks may travel faster or slower following a period of production, depending on the affects of both stress and strain fields. State-of-the-art geomechanical models do not fully account for the effect that changes in stress and strain fields have on seismic wave velocities. More specifically, current models for evaluating timeshifts are over-simplified as they do not accurately account for initial in situ stresses existing inside the formation or the effect of changes in rock stress on changes in sound wave velocity.

A more reliable methodology for forward-modeling of seismic timeshifts is offered herein. The methodology employs the geomechanical model described above, but conducts post-processing of stress and strain values for rock layers within the subsurface strata. These values are used in calculating a ratio of change in acoustic or seismic wave velocity. Different velocity equations are used depending on whether the rock material in each given layer is in an elastic regime, or has moved into a plastic regime. The velocity values ($v_p$ or $v_s$) are then used to compute incremental timeshifts $\Delta t_i$ in each rock layer i. A cumulative timeshift value is then obtained from selected rock layers i by summing the individual rock layer timeshifts $\Delta t_i$.

Figure 10:
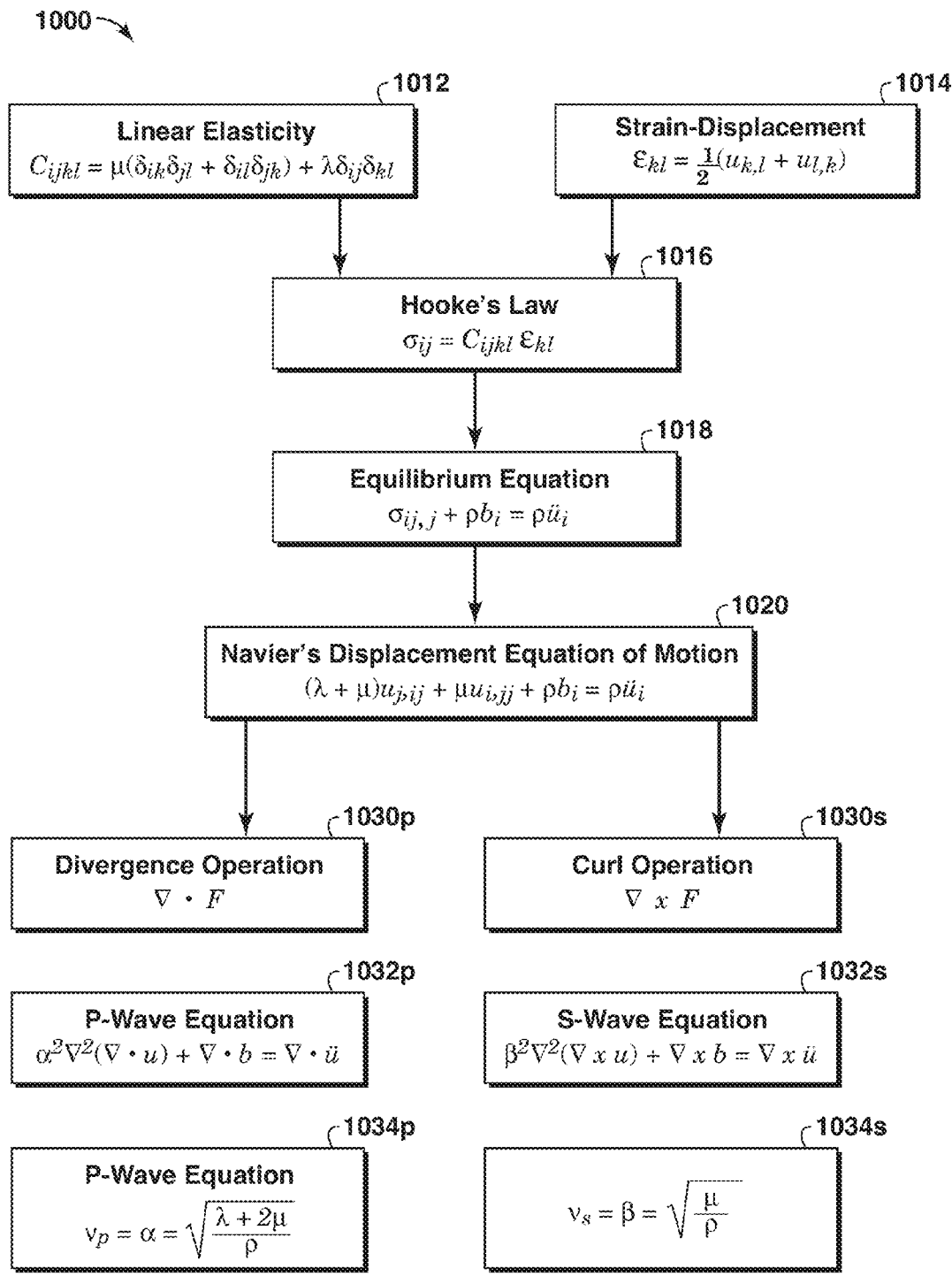
FIG. 10 is a flowchart showing steps that may be performed to calculate velocities of seismic waves through rock media. The velocity of "P" waves and "S" waves through the subsurface formation are separately calculated.

FIG. 10 is a flowchart for a mathematical process 1000 used to calculate velocities of seismic waves through rock media. The velocity of both "P" waves $v_p$ and "S" waves $v_s$ through the subsurface formation is computed.

The mathematical process 1000 first utilizes a formulation for linear elasticity of an isotropic elastic material. This is shown at Box 1012 of FIG. 10. The equation may be expressed as:

$$C_{ijkl} = \mu(\delta_{ik}\delta_{jl} + \delta_{il}\delta_{jk}) + \lambda\delta_{ij}\delta_{kl}$$

wherein: $C_{ijkl}$ is the elastic modulus tensor of a rock layer in component form,
$\lambda$ is the Lame' constant,
$\mu$ is the shear modulus, and
$\delta_{ij}$ is the Kronecker delta function with a value of 1 when i=j, and 0 otherwise.

The Lame' constant and the shear modulus are independent variables.

The mathematical process 1000 also utilizes a formulation for strain displacement. This is shown at Box 1014. The equation may be expressed as:

$$\varepsilon_{kl} = \frac{1}{2}(u_{k,l} + u_{l,k})$$

wherein: $\epsilon_{kl}$ is strain,
$u_k$ is the component of displacement, and
$u_{k,l}$ is the derivative of the $k^{th}$ component with respect to the $l^{th}$ direction, written as $$\frac{du_k}{dx_l}$$

It is noted that both the linear elasticity equation 1012 and the strain-displacement equation 1014 are written in terms of tensors. A tensor is the mathematical idealization of a geometric or physical quantity whose analytic description, relative to a fixed frame of reference, consists of an array of numbers. Examples of tensors used in engineering are the stress tensor and the deformation gradient tensor.

By way of additional background, geometric and physical quantities may generally be categorized by considering the degrees of freedom inherent in their description. Such quantities include scalar quantities, vector-like quantities, and quadratic-form quantities.

Scalar quantities are those that can be represented by a single number. Examples include speed, mass, and temperature. Scalar quantities are measured in terms of quantifiable units.

Vector-like quantities are those that require a list of numbers for their description. An example of a vector-like quantity is force. In this respect, force may call not only for a numerical value, but also for a numerically indicated direction. However, vector-like quantities may also be measured in terms of quantifiable units.

Finally, quantities having a quadratic form naturally require a multiply-indexed array for their description. These latter quantities can only be conceived of as tensors, with the tensors being indicated by subscripts. Second order tensors are often presented in the form of a matrix.

It is noted that the tensor notion is somewhat general and can be applied to all of the above examples. In this respect, scalars and vectors are special kinds of tensors. The feature that distinguishes a scalar from a vector, and that distinguishes both of those from a more general tensor quantity, is the number of indices in the representing array. This number is called the rank of a tensor. Thus, scalars are rank zero tensors (no indices at all), and vectors are rank-one tensors. Stated another way, tensors are generalizations of scalars (no indices), vectors (exactly one index), and matrices (that have exactly two indices).

Every tensor has an index. Each index of a tensor ranges over the number of dimensions of space. Thus, an $n^{th}$ rank tensor in m-dimensional space is a mathematical object that has "n" indices and "$m^n$" components and obeys certain transformation rules. Objects that transform like zeroth-rank tensors are called scalars; those that transform like first-rank tensors are called vectors; and those that transform like second-rank tensors are called matrices.

The number of indices represents the order of a tensor. For example, a vector (1-tensor) in 3-D space has one index and three components in each corresponding base vector direction. This may be represented as:

$$\underline{v} = v_i \underline{e}_i = v_1 \underline{e}_1 + v_2 \underline{e}_2 + v_3 \underline{e}_3$$

A stress tensor is a second-order tensor that has two indices and nine components. This may be expressed as:

$$\underline{\sigma} = \sigma_{ij} \underline{e}_i \otimes \underline{e}_j$$
$$= \sigma_{11}\underline{e}_1 \otimes \underline{e}_1 + \sigma_{12}\underline{e}_1 \otimes \underline{e}_2 + \sigma_{13}\underline{e}_1 \otimes \underline{e}_3 +$$
$$\sigma_{21}\underline{e}_2 \otimes \underline{e}_1 + \sigma_{22}\underline{e}_2 \otimes \underline{e}_2 + \sigma_{23}\underline{e}_2 \otimes \underline{e}_3 +$$
$$\sigma_{21}\underline{e}_2 \otimes \underline{e}_1 + \sigma_{22}\underline{e}_2 \otimes \underline{e}_2 + \sigma_{23}\underline{e}_2 \otimes \underline{e}_3$$

wherein: $\sigma_{ij}$ represents the $j^{th}$ component of stress action on the face of the $i^{th}$ base vector as normal.

The notation for a tensor is similar to that of a matrix (i.e., $A = (a_{ij})$), except that a tensor $a_{ijk} \ldots, a_{ijk} \ldots, a_{ijk} \ldots$, etc. may have an arbitrary number of indices. In addition, a tensor with rank r+s may be of mixed type (r, s), consisting of "r" so-called "contravariant" (upper) indices and "s" "covariant"

(lower) indices. Note that the positions of the slots in which contravariant and covariant indices are placed are significant. For example, $a_{\mu\nu}{}^{\lambda}$ is distinct from $a_{\mu}{}^{\nu\lambda}$.

Tensors may be operated on by other tensors (such as metric tensors, the permutation tensor, or the Kronecker delta) or by tensor operators (such as the covariant or semicolon derivatives). The manipulation of tensor indices to produce identities or to simplify expressions is known as index gymnastics, which includes index lowering and index raising as special cases. These can be achieved through multiplication by a so-called metric tensor $g_{ij}$, $g^{ij}$, $g_i{}^j$, etc. An example is:

$$g^{ij} A_j = A^i \qquad (15)$$

$$g_{ij} A^j = A_i \qquad (16)$$

(Malvern, "Introduction to the Mechanics of a Continuous Medium," pp. 576-588 (1969)).

Contravariant second-rank tensors are objects which transform as:

$$A'^{ij} = \frac{dx'_i}{dx_k}\frac{dx'_j}{dx_l} A^{kl}$$

Covariant second-rank tensors are objects which transform as:

$$C'_{ij} = \frac{dx'_k}{dx'_i}\frac{dx_l}{dx'_j} C_{kl}$$

Mixed second-rank tensors are objects which transform as:

$$B'^{i}_{j} = \frac{dx'_i}{dx_k}\frac{dx_l}{dx'_j} B^{k}_{l}$$

If two tensors A and B have the same rank and the same covariant and contravariant indices, then they can be added as follows:

$$A^{ij} + B^{ij} = C^{ij}$$

$$A_{ij} + B_{ij} = C_{ij}$$

$$A^{i}_{j} + B^{i}_{j} = C^{i}_{j}$$

Tensor notation can provide a concise way of writing vector and more general identities. For example, in tensor notation, the dot product u·v is written:

$$u \cdot v = u_i v^i$$

where repeated indices are summed using Einstein summation. "u" and "v" represent vectors, or 1-tensor terms.

Similarly, the cross product can be concisely written as:

$$u \times v = \epsilon_{ijk} u^j v^k$$

where $\epsilon_{ijk}$ is the permutation tensor.

The generalization of the dot product applied to tensors is called tensor contraction, and consists of setting two unlike indices equal to each other and then summing using the Einstein summation convention.

Various types of derivatives can be taken of tensors, the most common being the comma derivative and the covariant derivative.

Returning now to FIG. 10, the next mathematical step is shown in Box 1016. This shows an application of Hooke's Law. Hooke's Law relates tensors stress and tensors strain with a $4^{th}$ order elasticity tensor, as follows:

$$\sigma_{ij} = C_{ijkl} \epsilon_{kl}$$

wherein: $\sigma_{ij}$=stress,
$C_{ijkl}$=elastic modulus, and
$\epsilon_{kl}$=strain.

Thus, under Hooke's Law, four indices (i,j,k,l) are provided.

Hooke's Law addresses the relationship between stress and strain. Under Hooke's Law, deformation of a body is in an elastic regime if the current stress depends on current value of strain only.

Based upon Hooke's Law 1016, a force equilibrium equation from Newton's second law of physics may be applied. The equilibrium equation is set out in Box 1018, as follows:

$$\sigma_{ij,j} + \rho b_i = \rho \ddot{u}_i$$

wherein: $\sigma_{ij,j}$=stress gradient,
$\rho$=density,
$b_i$=body force for the $i^{th}$ base vector,
$\ddot{u}_i$=the second derivative of displacement for the $i^{th}$ base vector, indicating acceleration.

If one combines equations 1012, 1014, 1016, and 1018, an equation of motion can be expressed in terms of displacement. This is presented at Box 1020:

$$(\lambda+\mu)u_{j,ij} + \mu u_{i,jj} + \rho b_i = \rho \ddot{u}_i$$

wherein: $\lambda$ is the Lame' constant,
$\mu$ is the shear modulus,
u is the displacement
$\rho$ is density,
$b_i$ is the body force for the $i^{th}$ base vector,
$\ddot{u}_i$ is the second derivative of displacement for the $i^{th}$ base vector, representing acceleration.

The equation 1020 is termed Navier's displacement equation of motion. A person of ordinary skill in the art of solid mechanics will be familiar with Navier's displacement equation of motion and its derivation.

Based on the displacement equation of motion 1020, velocities may be calculated for both "P" waves and "S" waves. Once again, "P" wave velocity is denoted as $v_p$, while "S" wave velocity is denoted $v_s$. The $v_p$ and $v_s$, wave velocity values evolve from the force equilibrium equation 1018 and Navier's displacement equation of motion 1020.

First, calculation of the velocity of "P" waves $v_p$ is shown. This calculation is based on a divergence equation, represented at Box 1030p. The divergence equation 1030p involves the divergence of a vector field F, denoted as $\nabla \cdot F$.

The divergence of a vector field F is defined by a limit of the surface integral as follows:

$$\nabla \cdot F = \lim_{V \to 0} \frac{\oint_S F \cdot da}{V}$$

wherein:

$$\oint_S$$

is a surface integral,

F is a vector field integrated over a closed infinitesimal boundary surface defined as S=∂v surrounding a volume element V, which is taken to size zero using a limiting process, V is the volume element, and ∇ is a symbol variously known as "del" or "nabla."

The divergence of a vector field is a scalar field. If ∇·F=0, then the field is said to be a "divergenceless field."

The physical significance of the divergence of a vector field is the rate at which "density" exits a given region of space. The definition of the divergence therefore follows naturally by noting that, in the absence of the creation or destruction of matter, the density within a region of space can change only by having it flow into or out of the region. By measuring the net flux of content passing through a surface surrounding the region of space, it is therefore immediately possible to say how the density of the interior has changed. This property is fundamental in physics, where it goes by the name "principle of continuity." When stated as a formal theorem, it is called the divergence theorem, also known as Gauss's theorem.

A formula for the divergence of a vector field can be expressed in Cartesian coordinates. This is done by constructing a hypothetical infinitesimal cubical box oriented along the coordinate axes around an infinitesimal region of space. There are six sides to this box, and the net "content" leaving the box is therefore simply the sum of differences in the values of the vector field along the three sets of parallel sides of the box. Writing $F=F_x, F_y, F_z$, it follows:

$$\nabla \cdot F = \frac{dF_x}{dx} + \frac{dF_y}{dy} + \frac{dF_z}{dz} \quad \text{Eq. (1)}$$

This formula also provides the motivation behind the adoption of the symbol ∇ for the divergence. Interpreting ∇ as the gradient operator:

$$\nabla = \frac{d}{dx}\hat{i} + \frac{d}{dy}\hat{j} + \frac{d}{dx}\hat{k}$$

The "dot product" of this vector operator with the original vector field $F=F_x, F_y, F_z$ is Equation (1), above.

A "P" wave equation is shown at Box 1032p. This is expressed as:

$$\alpha^2 \nabla^2 (\nabla \cdot u) + (\nabla \cdot b) = \nabla \cdot \ddot{u}$$

wherein: ∇ is a symbol variously known as "del" or "nabla,"

u is the vector field of fluid velocity,

α is velocity, b is the body force,

ü is the second derivative of displacement, represent acceleration.

The "P" wave equation 1032p may be derived from Navier's displacement equation of motion 1020 by first taking Navier's displacement equation of motion:

$$(\lambda+\mu)u_{j,ij}+\mu u_{i,jj}+\rho b_i=\rho \ddot{u}_i \quad 1020$$

and rewriting it in vector form as follows:

$$\mu\nabla^2 u+(\lambda+\mu)\nabla(\nabla u)+\rho b=\rho \ddot{u} \quad \text{Eq. (2)}$$

Equation (2) can be further re-written using:

$$\nabla^2 u = \nabla(\nabla \cdot u) - \nabla \times (\nabla \times u) \quad \text{Eq. (3)}$$

The value of density (ρ) is divided on both sides of Equation (2) to produce:

$$\alpha^2 \nabla(\nabla \cdot u) - (\beta^2 \nabla \times \nabla \times u) + b = \ddot{u} \quad \text{Eq. (4)}$$

Applying the divergence operation on Equation (4), and using:

$$\nabla[\nabla(\nabla \cdot u)] = \nabla^2(\nabla \cdot u) \quad \text{Eq. (5)}$$

and $$\nabla(\nabla \times \nabla \times u) = 0 \quad \text{Eq. (6)}$$

yields the "P" wave equation:

$$\alpha^2 \nabla^2(\nabla \cdot u) + (\nabla \cdot b) = \nabla \cdot \ddot{u} \quad \text{Eq. (7), or } 1032p$$

From the "P" wave equation 1032p, the velocity $v_p$ of the "P" wave may be determined. This is indicated at Box 1034p. The equation is:

$$v_p = \alpha = \sqrt{\frac{\lambda + 2\mu}{\rho}}$$

wherein: $v_p$ is "P" wave velocity (α),

μ is the shear modulus,

λ is the Lame' constant, and

ρ is the density.

To produce the "P" wave equation 1032p, one may divide Equation (2) by density (ρ) which produces:

$$a^2 = \frac{\lambda + 2\mu}{\rho}$$

$$\alpha = \sqrt{\frac{\lambda + 2\mu}{\rho}}$$

This yields Equation (4), and $$\nabla \cdot u = \varepsilon_{ii} = \frac{dV}{V_0},$$

which is the volumetric strain representing fractional volume change.

Second, calculation of the velocity of "S" waves $v_s$ is shown. This calculation is based on a curl operation, represented at Box 1030s. The curl operation 1030s involves the curl of a vector field F, denoted as ∇×F.

The curl of a vector field F, denoted "curl (F)" or "∇×F," is defined as the vector field having magnitude equal to the maximum "circulation" at each point and to be oriented perpendicularly to the plane of circulation for each point. More precisely, the magnitude of ∇×F is the limiting value of circulation per unit area. This may be expressed as:

$$(\nabla \times F) \cdot \hat{n} = \lim_{A \to 0} \frac{\oint_C F \cdot ds}{A}$$

wherein:

$$\oint_C$$

is a line integral around an infinitesimal region of area A that is allowed to shrink to zero via a limiting process $\nabla$ is a symbol variously known as "del" or "nabla,"

F is a vector field integrated over a closed infinitesimal curve defined as $C=\partial s$ surrounding a volume element A A is an area, and $\hat{n}$ is the unit normal vector to this region.

The physical significance of the curl of a vector field is the amount of "rotation" or angular momentum of the contents of given region of space. In Cartesian coordinates, the curl is defined by:

$$\nabla \times F = \left(\frac{dF_z}{dy} - \frac{dF_y}{dz}\right)\hat{x} + \left(\frac{dF_x}{dz} - \frac{dF_z}{dx}\right)\hat{y} + \left(\frac{dF_y}{dx} - \frac{dF_x}{dy}\right)\hat{z}$$

This provides the motivation behind the adoption of the symbol $\nabla \times$ for the curl, since interpreting $\nabla$ as the gradient operator:

If $(\nabla \times F)=0$, then the field is said to be an irrotational field.

$$\nabla = \frac{d}{dx}\hat{i} + \frac{d}{dj}\hat{j} + \frac{d}{dz}\hat{k}$$

Another way of expressing the "cross product" of the gradient operator ($\nabla$) with F is given by:

$$\nabla \times F = \begin{vmatrix} \hat{x} & \hat{y} & \hat{z} \\ \frac{\partial}{\partial x} & \frac{\partial}{\partial y} & \frac{\partial}{\partial z} \\ F_x & F_y & F_z \end{vmatrix},$$

A somewhat more elegant formulation of the curl is given by the matrix operator equation:

$$\nabla \times F = \begin{bmatrix} 0 & -\frac{\partial}{\partial z} & \frac{\partial}{\partial y} \\ \frac{\partial}{\partial z} & 0 & -\frac{\partial}{\partial x} \\ -\frac{\partial}{\partial y} & \frac{\partial}{\partial x} & 0 \end{bmatrix} \begin{bmatrix} F_x \\ F_y \\ F_z \end{bmatrix}$$

An "S" wave equation is shown at Box 1032s. This is expressed as:

$$\beta^2 \nabla^2(\nabla \times u) + \nabla \times b = \nabla \times \ddot{u}$$

wherein: $\nabla$ is a symbol variously known as "del" or "nabla,"
u is displacement,
$\beta$ is velocity,
b is the body force,
$\ddot{u}$ is the second derivative of displacement, representing acceleration.

The "S" wave equation 1032s may be derived from Navier's displacement equation of motion 1020 by first taking Navier's displacement equation of motion $$(\lambda+\mu)u_{j,ij}+\mu u_{i,jj}+\rho+\rho b_i=\rho \ddot{u}_i \qquad 1020$$

and rewriting it in vector form as follows:

$$\mu \nabla^2 u + (\lambda+\mu)\nabla(\nabla u) + \rho b = \rho \ddot{u} \qquad \text{Eq. (2)}$$

Equation (2) can be further re-written using:

$$\nabla^2 u = \nabla(\nabla \cdot u) - \nabla \times (\nabla \times u) \qquad \text{Eq. (3)}$$

The value of density ($\rho$) is divided on both sides of Equation (3) to produce:

$$\alpha^2 \nabla(\nabla \cdot u) - \beta^2 \nabla \times \nabla \times u + b = \ddot{u} \qquad \text{Eq. (4)}$$

Applying the curl operation on Equation (4), and using:

$$\nabla \times [\nabla(\nabla \cdot u)] = 0 \qquad \text{Eq. (8)}$$

and $$\nabla \times (\nabla \times \nabla \times u) = -\nabla^2(\nabla \times u) \qquad \text{Eq. (9)}$$

yields the "S" wave equation:

$$\beta^2 \nabla^2(\nabla \times u) + (\nabla \times b) = \nabla \times \ddot{u} \qquad \text{Eq. (10), or 1032s}$$

From the "S" wave equation, the velocity $v_s$ of the "S" wave may be determined. This is indicated at Box 1034s. The equation is:

$$v_s = \beta = \sqrt{\frac{\mu}{\rho}}$$

wherein: $v_s$ is "S" wave velocity ($\beta$),
$\mu$ is the shear modulus, and
$\rho$ is the density.

To produce the "S" wave equation 1032s, one may divide Equation (2) by density ($\rho$) which produces:

$$\beta^2 = \frac{\mu}{\rho}$$

$$\beta = \sqrt{\frac{\mu}{\rho}}$$

This yields Equation (4), and $\nabla \times u$, which is the small rotation of a line element.

Having set out the mathematical processes 1000 for calculating wave velocities $V_p$, $V_s$, the method for predicting time-lapse seismic timeshifts in a three-dimensional geomechanical system may be further established. This is accomplished through post-processing after the steps of method 900 in FIGS. 9A and 9B. Thus, a systematic method is offered to conduct multi-scale geomechanics analyses for predicting time-lapse seismic timeshifts by employing a full-physics based model and, optionally, more refined submodels.

Figure 11:
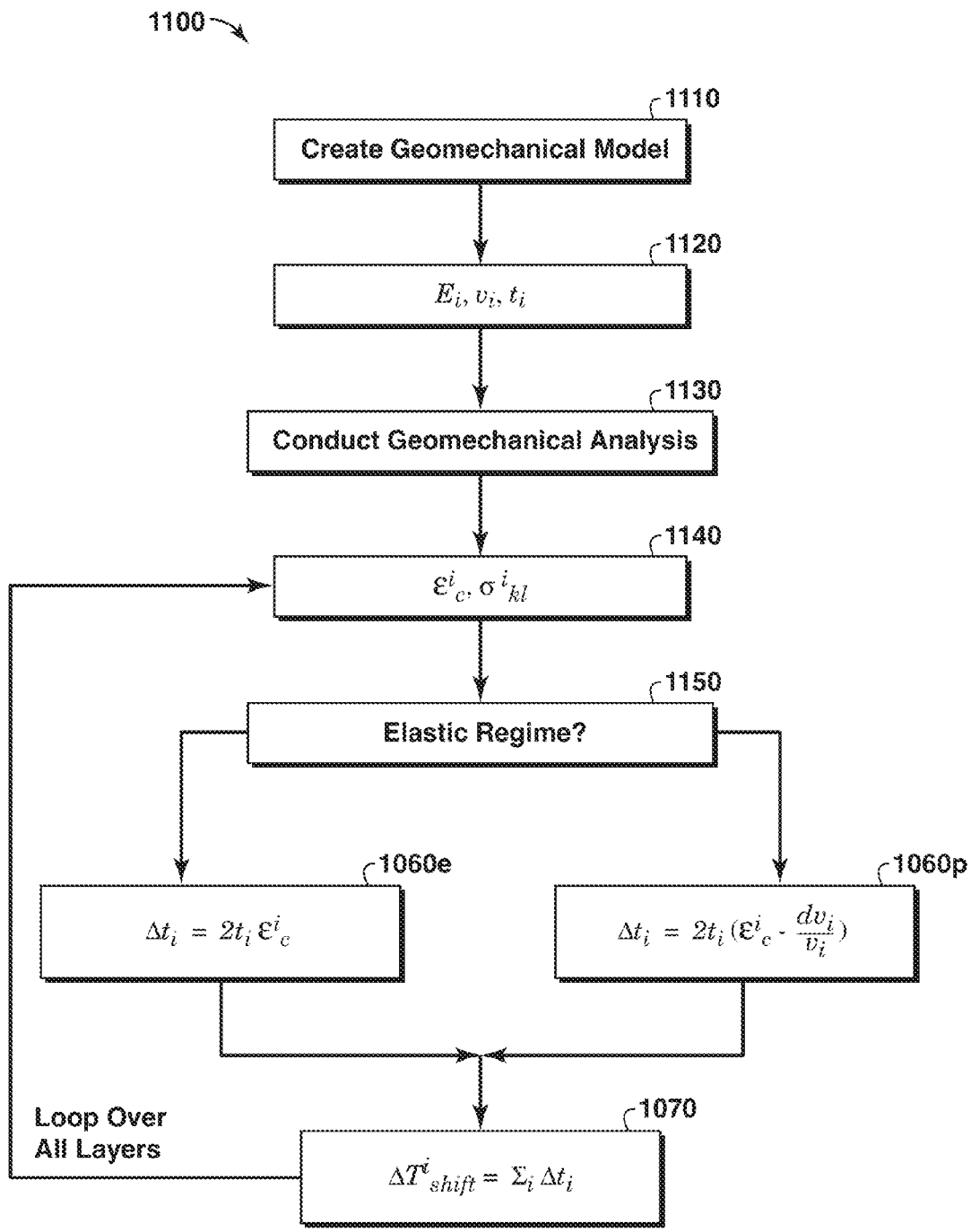
FIG. 11 is a flowchart showing steps that may be performed in connection with post-processing of the geomechanical simulation. As a result of the post-processing, a cumulative timeshift for rock layers in a subsurface formation is provided.

FIG. 11 is a flowchart showing steps that may be performed in connection with post-processing 1100 of the geomechanical simulation. As a result of the post-processing 1100, a cumulative timeshift $\Delta T_i$ for rock layers i in a subsurface formation is provided. Calculation of the cumulative timeshift $\Delta T_i$ is based upon incremental timeshift values $\Delta t_i$ for each rock layer i being evaluated.

The first step in the method 1100 is, of course, to create the geomechanical model. This step is indicated at Box 1110. Box 1110 reflects the steps 910 through 950 of the reservoir simulation method 900 discussed above. Creating the geomechanical model 1110 generally means establishing the geologic structure for a hydrocarbon development area and creating a finite element mesh representing the geologic features and rock properties of the geologic structure.

As described above, establishment of the geologic structure is based upon log data, seismic data, and other relevant information that describes the geology of the subsurface strata under study. The structure incorporates the mechanical and thermal properties for the constituent layers making up the subsurface strata. This information is primarily derived from laboratory rock mechanics tests conducted on core samples, but may also be derived from completion test records, drilling records, a history of casing failures, and records of sand production.

Creating the geomechanical model 1110 may also include mapping the pore pressure within the geomechanical system. This is in accordance with steps 960 and 970. Pore pressure is mapped at a first time for each node with the mesh, and then at a plurality of additional times within the mesh.

A next step in the method for calculating timeshifts 1100 involves calculating certain values for individual rock layers. This step is shown at Box 1120. The individual values include Young's Modulus $E_i$, initial seismic wave velocity $v_p$ and/or $v_s$, and time for travel (one-way) through each rock layer i. Young's Modulus $E_i$ is primarily acquired from laboratory rock mechanics tests conducted on core samples; initial seismic velocities of "P" waves and "S" waves are acquired through the process 1000; and initial time is determined by dividing initial velocity values $v_p$ and/or $v_s$ through rock layer thicknesses.

A next step in the method for calculating timeshifts 1100 involves conducting a geomechanical analysis. This step is shown at Box 1130. Box 1130 reflects the step 980 of the reservoir simulation method 900 discussed above. The purpose of the geomechanical analysis step 1130 is to compute the time-dependent stress and strain distributions during the production/injection history of the development area. As a result of this computation, values are determined for strain $\epsilon_c^i$ and for stress $\sigma_{kl}^i$ at various rock layers i in the subsurface formation. The computation of these values is indicated at Box 1140. Thus, of significance, the current method takes into consideration not only compaction strain, but also stress forces at work in the subsurface strata under study.

The method for calculating timeshifts 1100 next makes inquiry as to whether the material in a rock layer "i" is in an elastic regime or a plastic regime. This query is shown at Box 1150. This is preferably done for each rock layer "i" from the surface to the reservoir. However, it may be conducted for one or more layers within a formation, or for layers within two or more formations.

A determination of the stress regime for material in a rock layer i is important because seismic wave velocities through the rock layer are both stress and strain dependent. This means that changes in seismic wave velocity will occur as a rock material becomes plastic. A determination of stress regime may be done, in one aspect, using a geomechanical solver program. When a yield surface is recognized as growing or pushing out, the rock layer is considered to have entered the plastic regime. If the yield surface remains generally static, that is, it is not pushing outwards, the stress state is still in the elastic regime.

The systematic method 1100 for time-lapse seismic timeshift predictions described herein is physics based. This means that empirical relations are not employed to relate velocities to compaction strain as in known seismic-based simulations; rather, changes in velocity are determined from changes in both strain and stress fields. Changes in velocity, in turn, affect incremental timeshifts.

A next step in the method 1100 is to calculate incremental timeshifts for the rock layers from the surface to the reservoir. The incremental timeshifts are designated in FIG. 11 as $\Delta t_i$.

The $\Delta t_i$ values are calculated differently depending on whether the material in a given rock layer "i" is in an elastic regime or in a plastic regime. This, again, is due to changes in seismic wave velocity as material in a rock layer moves from an elastic regime to a plastic regime. If the material is in an elastic regime, then the $\Delta t_e$ values are calculated according to the following equation:

$$\Delta t_i = 2 t_i \times \epsilon_i.$$

This is shown in Box 1160e. It can be seen that incremental timeshift is dependent on strain only. Of course, rock layer thickness is also a factor. However, as discussed more fully below, change in rock layer thickness is incorporated into the strain value.

However, if the material is in a plastic regime, then the $\Delta t_i$ values are calculated according to the following equation:

$$\Delta t_i = 2 t_i \left( \epsilon_i - \frac{dv_i}{v_i} \right).$$

This is shown in Box 1160p. It can be seen here that the incremental timeshift value is dependent on both strain and changes in velocity.

Mathematical derivations for the equations in step 1160e and 1160p are demonstrated below in connection with FIG. 12.

This elastic-versus-plastic inquiry 1150 and timeshift calculation 1160e or 1160p is conducted iteratively over all subsurface layers. The model 1100 permits the analyst to refine the study to submodels for only a subset of layers.

The method for calculating timeshifts 1100 next calculates a cumulative timeshift. This is designated in FIG. 11 as $\Delta T_{shift}^i$. It may also be referred to herein as $\Delta T_i$. The cumulative timeshift $\Delta T_i$ is calculated as follows:

$$\Delta T_{shift}^i = 2(\Delta t_1 + \Delta t_2 + \Delta t_3 + \ldots + \Delta t_n)$$

$$\sum_i 2 \Delta t_i.$$

This is shown in Box 1170.

The cumulative timeshift $\Delta T_{shift}^i$ is used to correct the travel time values for seismic waves. FIG. 12 demonstrates this correction.

Figure 12:
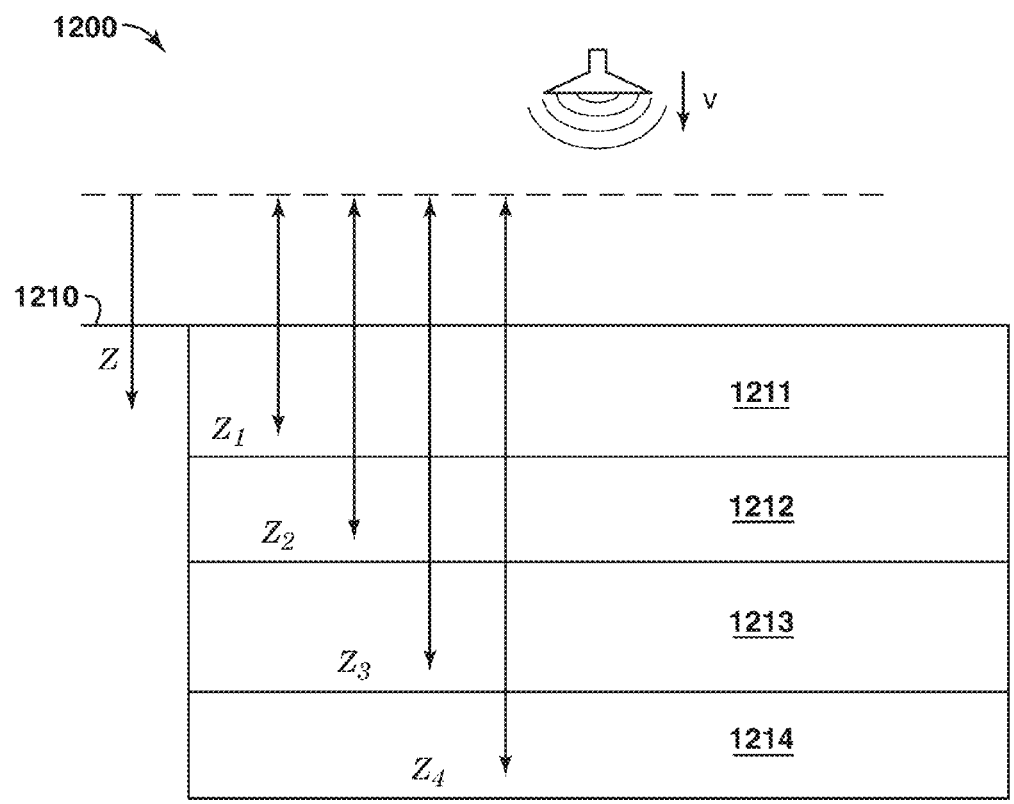
FIG. 12 is a diagram showing four rock layers within a subsurface formation. Sound waves are being directed from the surface into the rock layers, with the sound layers then echoing back to the surface.

FIG. 12 is a diagram showing four rock layers within a subsurface formation. Sound waves "V" are being directed from an earth surface 1200 into rock layers 1210. The individual sound waves "V" echo back to the surface 1200.

The rock layers 1210 are separately designated as 1211, 1212, 1213, and 1214. Each of the rock layers 1210 receives seismic waves "V". In order to reach the various rock layers 1210, the seismic waves V must travel different distances Z:

for a seismic wave to completely traverse the first rock layer 1211, it must travel a distance $z_1$;

for a seismic wave to completely traverse the first rock layer 1212, it must travel a distance $z_2$;

for a seismic wave to completely traverse the first rock layer 1213, it must travel a distance $z_3$;

for a seismic wave to completely traverse the first rock layer 1214, it must travel a distance $z_4$.

The total distance Z can be mathematically expressed as velocity of the seismic wave multiplied by the time it takes the seismic wave to travel through the various rock layers:

$$Z = v \times t$$

where: Z=total depth of travel under study (in feet or meters),
v=velocity (in feet/second or meters/second), and
t=one-way travel time (in seconds).

In actuality, the velocity changes slightly in each layer. Thus, to get a truly accurate measurement of distance, the velocities and travel times through each layer must be determined.

The total distance Z may be expressed in an incremental form. The incremental form represents a change in distance dZ over a previous calculation. In incremental form, the change in distance dZ can be mathematically expressed as:

$$dZ = vdt + tdv$$

It follows that the relative increment form may be shown as:

$$\frac{1}{vt}(dZ) = \frac{1}{vt}(vdt + tdv)$$

$$\frac{dZ}{vt} = \frac{vdt}{vt} + \frac{tdv}{vt}$$

$$\frac{dZ}{Z} = \frac{dt}{t} + \frac{dv}{v}$$

It is here noted that dZ/Z represents the ratio of change in thickness of a rock layer to the original thickness of the rock layer. This is another expression for compaction strain, or $\epsilon_i$. Young's modulus is part of the equations in both steps 1160e and 1160p from FIG. 11.

It is also noted here that dt/t represents the ratio of change in travel time of a seismic wave through a rock layer to the original travel time. Multiplying both sides of the equation by t removes t from the denominator of dt.

$$t\left(\frac{dZ}{Z}\right) = t\left(\frac{dt}{t} + \frac{dv}{v}\right)$$

$$\frac{tdZ}{Z} = dt + \frac{tdv}{v}$$

$$dt = \frac{tdZ}{Z} - \frac{tdv}{v}$$

$$dt = t_i\left(\frac{dZ_i}{Z_i} - \frac{dv_i}{v_i}\right).$$

This produces the timeshift ratio $\Delta t_i$ from steps 1160e and 1160p:

$$dt_i = \Delta t_i.$$

The value of $\Delta t_i$ is multiplied by two in steps 1160e and 1160p to account for two-way travel time through the rock layer. Hence, $$\Delta t_i = 2t_i\left(\frac{dZ_i}{Z_i} - \frac{dv_i}{v_i}\right)$$

$$= 2t_i\left(\epsilon_i - \frac{dv_i}{v_i}\right).$$

This is the expression of step 1160p for rock material in a plastic regime.

In an elastic regime, wave velocity remains constant in all directions. Thus, $$\frac{dv_i}{v_i}$$

is 0. This simplifies the timeshift equation to:

$$\Delta t_i = 2t_i\left(\frac{dZ_i}{Z_i} - \frac{dv_i}{v_i}\right)$$

$$= 2t_i\left(\epsilon_i - \frac{dv_i}{v_i}\right)$$

$$= 2t_i(\epsilon_i - 0)$$

$$= 2t_i \times \epsilon_i.$$

This is the expression of step 1160e for rock material in an elastic regime.

Referring again to FIG. 12, the time $t_i$ it takes for a seismic wave to travel through the individual rock layers 1210 may be expressed as:

For rock layer 1211: $t_1 = \frac{z_1}{v_1}$

For rock layer 1212: $t_2 = \frac{z_2 - z_1}{v_2}$

For rock layer 1213: $t_3 = \frac{z_3 - z_2}{v_3}$

For rock layer 1214: $t_4 = \frac{z_4 - z_3}{v_4}$

Again, the time $t_i$ values are multiplied by two to account for the echo of the seismic waves back through the rock layers 1210.

Based on Box 1034p of FIG. 10, the corresponding velocities for "P" waves through the individual rock layers 1210 may be expressed as:

For rock layer 1211: $v_1 = \sqrt{\frac{\lambda_1 + 2\mu_1}{\rho_1}}$

For rock layer 1212: $v_2 = \sqrt{\frac{\lambda_2 + 2\mu_2}{\rho_2}}$

For rock layer 1213: $v_3 = \sqrt{\frac{\lambda_3 + 2\mu_3}{\rho_3}}$

For rock layer 1214: $v_4 = \sqrt{\frac{\lambda_4 + 2\mu_4}{\rho_4}}$

The velocity values $v_i$ are not needed when material in a rock layer is in an elastic regime. This is because $$\frac{dv_i}{v_i} = 0.$$

However, the velocity values $v_1, v_2, v_3, v_4, \ldots$ need to be calculated when the material enters the plastic regime.

The expression $(\lambda+2\mu)$ is written in terms of elasticity modulus. In some situations it is preferred to calculate velocity values in terms of rock compressibility rather than elasticity modulus. Rock compressibility is inversely proportional to $(\lambda+2\mu)$. Thus, (uniaxial bulk) compressibility may be expressed as:

$$C_{bu} \propto \cdot \frac{1}{\lambda+2\mu}$$

Consequently, the incremental reduction in sound speed for a rock layer may be described as:

$$\frac{dv_i}{v_i} = \frac{v-v_0}{v_0}$$
$$= \frac{\frac{1}{\sqrt{\rho C_{bu}^p}} - \frac{1}{\sqrt{\rho_0 C_{bu}}}}{\frac{1}{\sqrt{\rho_0 C_{bu}}}}$$
$$= \frac{\sqrt{C_{bu}}}{\sqrt{C_{bu}^p}} \frac{\sqrt{\rho_0}}{\sqrt{\rho}} - 1$$
$$= \frac{\sqrt{J}\sqrt{C_{bu}}}{\sqrt{C_{bu}^p}} - 1$$

wherein: J is the "Jocobian, which is the ratio of incremental change in volume,
$C_{bu}$ is uniaxial bulk compressibility,
$\rho_0$ is density, and
$\rho$ is current density.

Thus, the equation for the physics-based relative velocity change for arbitrary constitutive rock behavior using uniaxial bulk compressibility may be derived as follows:

$$\frac{dv_i}{v_i} \cong \frac{\sqrt{J}\sqrt{C_{bu}}}{\sqrt{C_{bu}^p}} - 1$$

For a plasticity model using pressure-dependent type Drucker-Prager models having an associated or a non-associated flow rule, the instantaneous tangential stiffness may be expressed as:

$$C_{ijkl}^p \cong C_{ijkl} - \frac{1}{h}\left(3K\alpha_1\delta_{ij} + \frac{\mu}{\sqrt{J_2}}s_{ij}\right)\left(3K\alpha_2\delta_{kl} + \frac{\mu}{\sqrt{J_2}}s_{kl}\right)$$

wherein: $C_{ijkl}$ is elastic modulus,
$s_{ij}$ is a deviatoric stress component, expressed as $$\sigma_{ij} - \frac{\sigma_{kk}}{3}\delta_{ij}$$

h is an intermediate term, or scalar function, expressed as $$\mu + 9K\alpha_1\alpha_2 + \frac{\alpha_2 I_1 + \sqrt{J_2}}{3k}(1+\sqrt{3\alpha_1})^2 H_p$$

$H_p$=plastic modulus, expressed as $$\frac{d\sigma_e}{d\varepsilon_p}$$

$$J_2 = \frac{1}{2}s_{ij}s_{ij},$$

which is the second invariant of deviatoric stress tensor
$I_1 = \sigma_{ii}$, which is the first stress invariant of the stress tensor $$k = \frac{I_1 + \sqrt{3}\alpha_1}{\sqrt{3}}\sigma_e,$$

which is an intermediate term, scalar function
$\sigma_e$ Mises (Effective) stress, $\sigma_e = \sqrt{3J_2}$
$\alpha_1$ tangent of friction angle of yield surface,
$\alpha_2$ tangent of dilation angle of plastic flow potential,
$\delta_{ij}$ is a Kronecker delta with a value of 1 when i=j, and 0 otherwise, and
$\mu$ is shear modulus.

If the vertical direction is termed as 1-axis, the diagonal term $C_{1111}^p$ will be the most dominant term as compared to the off-axis terms. Thus $$C_{1111}^p >> |C_{1122}^p|$$

and $$C_{1111}^p >> |C_{1133}^p|$$

The "P" wave velocity $v_p$ is approximately $$v_P^{pl} \cong \sqrt{\frac{C_{1111}^p}{\rho}}$$

This is also true in calculating the "S" wave speed:

$$v_S^{pl} \cong \sqrt{\frac{C_{1212}^p}{\rho}}$$

As a result, $$\frac{dv_i}{v_i} = \frac{v-v_0}{v_0}$$
$$= \frac{\frac{\sqrt{C_{1111}^p}}{\sqrt{\rho}} - \frac{\sqrt{C_{1111}}}{\sqrt{\rho_0}}}{\frac{C_{1111}}{\sqrt{\rho_0}}}$$

-continued $$= \frac{\sqrt{C^p_{1111}}}{\sqrt{\rho_0}} \frac{\sqrt{\rho_0}}{\sqrt{\rho}} - 1$$

$$= \frac{\sqrt{J}\sqrt{C^p_{1111}}}{\sqrt{C_{1111}}} - 1$$

wherein: J is the "Jocobian, which is the ratio of incremental change in volume, $C_{ijkl}$ is elastic modulus tensor of the rock layer in component form, $\rho_0$ is density, and $\rho$ is current density.

Using the $t_i$ and $v_i$ values described above, the incremental timeshift values $\Delta t_i$ from either equation 1160e or 1160p may be calculated. The cumulative timeshift $\Delta T_i$ value is then determined by summing the incremental timeshift values $\Delta t_i$ as follows:

$$\Delta T_i = \sum_i 2t_i \left( \varepsilon_i - \frac{dv_i}{v_i} \right)$$

$$= \sum_i \Delta t_i.$$

Again, for the elastic regime the equation simplifies to:

$$\Delta T_i = \sum_i 2t_i \left( \varepsilon_i - \frac{dv_i}{v_i} \right)$$

$$= \sum_i 2t_i (\varepsilon_i - 0)$$

$$= \sum_i 2t_i \times \varepsilon_i$$

$$= \sum_i \Delta t_i.$$

In either instance, cumulative timeshift $\Delta T_i$ is represented in Box 1170 of FIG. 11 as:

$$\Delta T_i = \sum_i \Delta t_i.$$

In order to demonstrate the utility of the post-processing methods herein, a multi-scale geomechanical simulation was conducted. The simulation was based on the production history of a simulated reservoir.

Figure 13A:
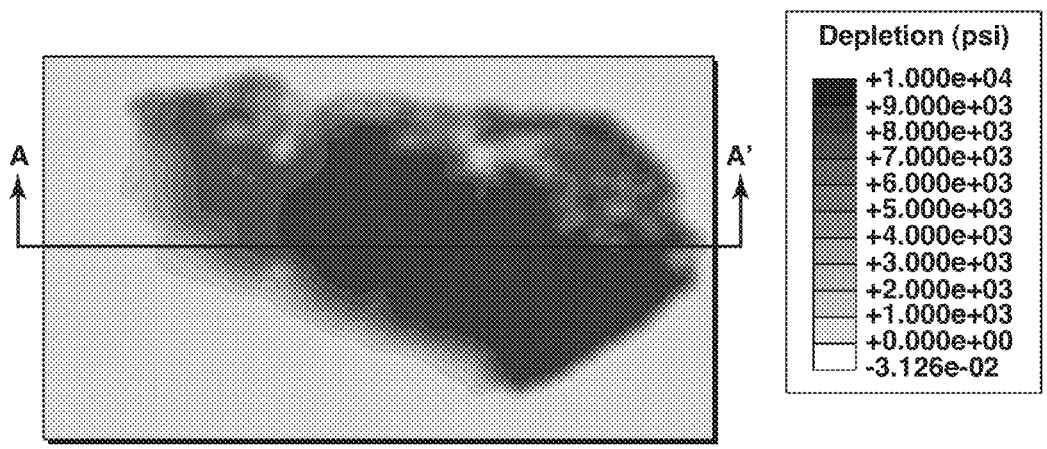
FIGS. 13A and 13B present a pair of reservoir maps generated from the geomechanical simulation of FIGS. 9A and 9B along with the post-processing steps of FIG. 11.

FIG. 13A is a plane view of a development area 1310. This is a simulated development area based upon the steps provided in FIG. 10. The development area 1310 has been in hydrocarbon production for a period of 7.3 years. A depletion contour of pore pressure at 7.3 years is provided.

The plane view of the development area 1310 is cut across a selected depth. In the view of FIG. 13A, the view is at a depth of 14,000 feet below ground level. The simulation shows pore pressure depletion within the subsurface formation along the given depth. Depletion is measured in units of psi in positive values.

In FIG. 13A, areas of depletion are shown in lighter shades of gray. For example, the center of the formation is generally at 6,300 psi. The depletion pressure drops away from the center of the development area 1310. This suggests that compaction is taking place in the center of the reservoir due to fluid removal. However, reservoir fluids remain to be produced away from the center of the formation.

Figure 13B:
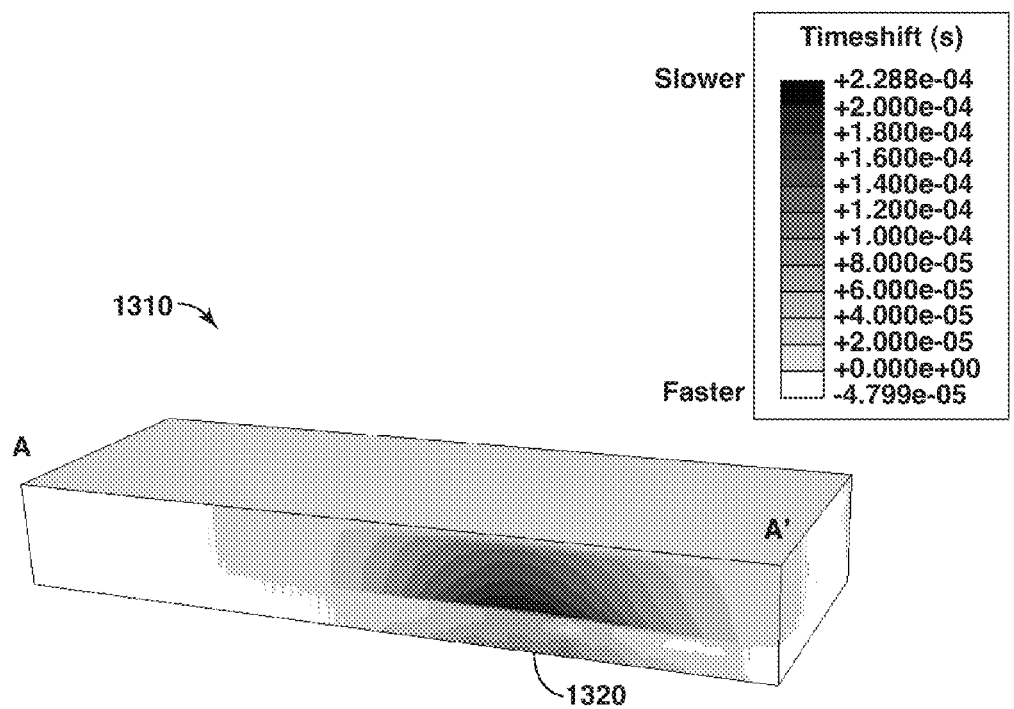

FIG. 13B is a perspective view of the development area 1310 of FIG. 13A. This again is part of the simulation of a reservoir that has undergone production for 7.3 years. In this view, a portion of the subsurface strata 1320 is seen, taken across line A-A' of FIG. 13A. The upper strata are at surface depth, i.e., 0 feet, while the lower strata are at a depth of about 14,000 feet below ground level. This is the depth of the plan view of FIG. 13A, and represents the top of the simulated reservoir.

In accordance with the simulation, timeshift values are obtained at various depths and locations in the subsurface strata 1320. In FIG. 13B, timeshift values within the subsurface strata 1320 are indicated. Areas of greater timeshift are shown in darker shades of gray. These areas experience greater changes in rock layer thickness, thereby creating time differentials.

It can be seen in FIG. 13B that an area of greatest timeshift is indicated at the center of the reservoir. This is the same location where the depletion pressure was the highest in FIG. 13A. The timeshift value is about $2.0 \times 10^{-5}$ seconds slower at the depth of the reservoir. Areas of timeshift extend upward through the subsurface strata 1320 above the center of the reservoir, suggesting compaction. The timeshift begins at $2.0 \times 10^{-5}$ seconds and slows to about $2.0 \times 10^{-4}$ seconds.

At peripheral areas of the reservoir, the timeshift values are lower, even down to zero. These areas have experienced little to no timeshifts. This, in turn, means that no changes have occurred in rock layer thickness, meaning that the strata 1320 have not experienced compaction due to production activities. This is particularly true in the upper strata where subsidence lags the compaction in the deeper reservoir.

Areas where timeshift values are greatest indicate places where rock layer thicknesses have changed. In the center of the reservoir where the timeshift values are the greatest, fluid depletion-induced compaction and resulting high compaction strain can be inferred.

Areas where timeshift values are lowest indicate places where rock layer thicknesses have not changed. It can be inferred that these peripheral areas have not experienced depletion-induced compaction, suggesting areas where future production activities may be fruitful. At the same time, it is understood that production-induced compaction in the reservoir will create tensile strain in the overburden above the reservoir. Whereas inside the reservoir high compaction strain causes forward timeshift, but it is offset by the slow velocity from plasticization of reservoir rock due to high depletion.

As demonstrated, a method is provided herein for predicting time-lapse seismic timeshifts in a three-dimensional geomechanical system by computer simulation. In one embodiment, the method includes defining physical or geometric boundaries for the geomechanical system. This is discussed in connection with Box 128 of FIG. 4, described above.

The method also includes acquiring history for at least one reservoir characteristic from multiple wells within the physical boundaries. In one aspect, this involves the assimilation of pore pressure history for the production area or geomechanical system under study. This step is consistent with Box 126 of FIG. 4. Historical pore pressure data may be gathered from downhole sensors residing in producing wells. Alternatively, or in addition, pore pressure history may be derived or interpolated using known reservoir analysis techniques. Pore pressure history is preferably acquired from multiple wells within the physical boundaries defining the geomechanical system.

As part of this step, temperature history may also be gathered. In this respect, the mechanical characteristics of some rock formations may be sensitive to temperature. Temperature data may also be obtained from downhole sensors residing in producing wells.

Other reservoir characteristics may also be acquired within the physical boundaries of the geomechanical system. These include porosity and permeability. Porosity and permeability data are typically obtained from well logs and core samples.

The method also includes determining whether a formation in the geomechanical system is in an elastic regime or a plastic regime. This is discussed in connection with Box 1150 of FIG. 11.

The method also includes obtaining a first seismic data set for the geomechanical system. The first seismic data set is taken at a first time. The method further includes obtaining a second seismic data set for the geomechanical system. The second seismic data set is taken at a second time. The second seismic data set may be taken from an actual seismic survey. More preferably, the second seismic data set is computed from a geomechanical simulation in accordance with step 1130 of FIG. 11. In either instance, the second seismic data set may include "P" wave velocity through one or more rock layers within a formation, "S" wave velocity through one or more rock layers within the formation, or combinations thereof.

The method also includes running a geomechanical simulation for the geomechanical system. This step is shown and discussed in connection with Box 1130 of FIG. 11. Running the simulation allows the analyst to simulate the effects of changes in the at least one reservoir characteristic on time-lapse seismic timeshifts in the formation. In one aspect, running a geomechanical simulation comprises calculating incremental timeshifts for a plurality of layers within the formation, and calculating a cumulative timeshift value from a summation of the incremental timeshifts in the formation. This is shown at Box 1170 of FIG. 11.

In one embodiment, the method includes additional steps prior to running the geomechanical simulation. These include acquiring mechanical properties of rock formations within the physical boundaries, and automatically creating a finite element mesh representing the geomechanical system. Here, the mesh defines a plurality of nodes representing points in space, with each point having potential displacement in more than one direction. The mesh preferably provides a positive value for any rock formations having a zero thickness as derived from subsurface data. In this way, a positive volume is created for each rock formation.

The method may also include mapping pore pressure within the geomechanical system at a first time for nodes within the mesh, and mapping pore pressure within the geomechanical system at a plurality of additional times to correspond to the nodes within the mesh. In this manner a pore pressure history is mapped and interpolations may be conducted.

As can be seen, an improved method for geomechanical modeling is offered herein. The method employs multi-scale geomechanical computer simulations of earth stress changes associated with the hydrocarbon recovery process. In various embodiments, the method allows an analyst to map pressure, temperature, fluid flow, displacement or stress boundary conditions from a map-based descretized simulation domain to a three-dimensional, finite-element-based descretized simulation domain. The methods herein may have particular application in translating production-related field measurements into appropriate solution constraints.

In addition, an improved method of calculating time-lapse seismic timeshifts is provided. The method is helpful in the area of analysis and forecasting reservoir depletion. The method is also helpful in predict well casing failures associated with hydrocarbon recovery. It also is helpful with analysis and forecasting capabilities for use with model predictive tools to manage reservoir pressure.

While it will be apparent that the invention herein described is well calculated to achieve the benefits and advantages set forth above, it will be appreciated that the invention is susceptible to modification, variation and change without departing from the spirit thereof.

What is claimed is:

1. A method for predicting time-lapse seismic timeshifts in a three-dimensional geomechanical system, comprising:
defining physical boundaries for the geomechanical system;
acquiring history for at least one reservoir characteristic from multiple wells within the physical boundaries;
determining whether a formation in the geomechanical system is in an elastic regime or a plastic regime;
obtaining a first seismic data set for the geomechanical system, the first seismic data set being taken at a first time;
obtaining a second seismic data set for the geomechanical system, the second seismic data set being taken at a second time;
running a computer-implemented simulation for the geomechanical system to simulate the effects of changes in the at least one reservoir characteristic on time-lapse seismic timeshifts in the formation, wherein running the geomechanical simulation comprises calculating incremental timeshifts for a plurality of layers within the formation and calculating a cumulative timeshift value from a summation of the incremental timeshifts in the formation.

2. The method of claim 1, wherein the geomechanical system comprises a hydrocarbon reservoir.

3. The method of claim 2, wherein obtaining a second seismic data set for the geomechanical system comprises acquiring field data from a post-production seismic survey.

4. The method of claim 2, wherein obtaining a second seismic data set for the geomechanical system is performed through the computer-implemented simulation.

5. The method of claim 4, wherein the second seismic data set comprises "P" wave velocity through rock layers within the formation, "S" wave velocity through rock layers within the formation, or combinations thereof.

6. The method of claim 1, wherein the cumulative timeshift value is defined as:

$$\Delta T_i = \sum_i \Delta t_i$$

where: $\Delta T_i$=cumulative timeshift value for the layers i in the formation, and
$\Delta t_i$=incremental timeshift in a layer i within the formation.

7. The method of claim claim 1, wherein the at least one reservoir characteristic comprises pore pressure history.

8. The method of claim 7, wherein changes in pore pressure within the geomechanical system are designed to simulate a decrease in pore pressure in connection with a production of hydrocarbons from the hydrocarbon reservoir.

9. The method of claim claim 1, wherein prior to running a geomechanical simulation, the method further comprises:
acquiring mechanical properties of rock formations within the physical boundaries;
automatically creating a finite element mesh representing the geomechanical system, the mesh defining a plurality of nodes representing points in space, each point having potential displacement in more than one direction;
mapping pore pressure within the geomechanical system at a first time for nodes within the mesh; and
mapping pore pressure within the geomechanical system at a plurality of additional times to correspond to the nodes within the mesh.

10. The method of claim 9, wherein the mesh provides a positive mesh element quality value for mesh elements encountering rock formation having a zero thickness as derived from subsurface data in order to create non-negative element volume for the zero-thickness rock formation in the finite element mesh.

11. The method of claim 6, wherein:
if the formation in the geomechanical system is in an elastic regime, the incremental timeshift is defined as $\Delta t_i = 2t_1 \times \epsilon_i$
where: $\Delta t_i$=incremental timeshift of a seismic wave in a layer i in the formation,
$t_i$=one-way travel time of the seismic waves in a layer i in the formation, and
$\epsilon_i$=strain in a layer i.

12. The method of claim 6, wherein:
if the formation in the geomechanical system is in a plastic regime, the incremental timeshift is defined as $$\Delta t_i = 2t_i \left( \varepsilon_i - \frac{dv_i}{v_i} \right)$$

where: $\Delta t_i$=incremental timeshift of a seismic wave in a layer i in the formation,
$t_i$=one-way travel time of the seismic wave in a layer i in the formation,
$\epsilon_i$=strain in the layer i, and $\frac{dv_i}{v_i}$ = change in wave velocity in the layer $i$ between the first and second times, divided by the original wave velocity at the first time.

13. The method of claim 12, wherein:
$dv_i$ is the change in velocity of "P" waves in a rock layer between the first and second time; and
$v_i$ is the original velocity of "P" waves at the first time.

14. The method of claim 13, wherein:

$$v_i = \sqrt{\frac{\lambda + 2\mu}{\rho}}$$

where: $\lambda$=Lame' constant,
$\mu$=shear modulus, and
$\rho$=density of a rock layer i.

15. The method of claim 12, wherein:
$dv_i$ is the change in velocity of "S" waves in a rock layer between the first and second times; and
$v_i$ is the original velocity of "S" waves at the first time.

16. The method of claim 15, wherein:

$$v_i = \sqrt{\frac{\mu}{\rho}}$$

where: $\mu$=shear modulus, and
$\rho$=density of a rock layer i.

17. The method of claim 4, wherein running a geomechanical simulation comprises:
calculating incremental timeshifts for the plurality of layers within each of at least two formations within the geomechanical system; and
calculating cumulative timeshift values from a summation of the incremental timeshifts in the each of at least two formations in order to create a multi-formation time-lapse timeshift profile.

18. The method of claim 17, wherein the cumulative timeshift values are each defined as:

$$\Delta T_i = \sum_i \Delta t_i$$

where: $\Delta T_i$=cumulative timeshift value for all layers in the at least two formations, and
$\Delta t_i$=incremental timeshift of a seismic wave in a layer i within the at least two formations.

19. The method of claim 17, wherein the at least one reservoir characteristic comprises pore pressure history.

20. The method of claim 19, wherein changes in pore pressure within the geomechanical system are designed to simulate a decrease in pore pressure in connection with a production of hydrocarbons from the hydrocarbon reservoir.

21. The method of claim 18, wherein prior to running a geomechanical simulation, the method further comprises:
acquiring mechanical properties of rock formations within the physical boundaries;
automatically creating a finite element mesh representing the geomechanical system, the mesh defining a plurality of nodes representing points in space, each point having potential displacement in more than one direction;
mapping pore pressure within the geomechanical system at a first time for nodes within the mesh; and
mapping pore pressure within the geomechanical system at a plurality of additional times to correspond to the nodes within the mesh.

22. The method of claim 21, wherein the mesh provides a positive value for any rock formations having a zero thickness as derived from subsurface data in order to create volume for each rock formation.

23. The method of claim 18, wherein:
if the formation in the geomechanical system is in an elastic regime, the incremental timeshift is defined as $\Delta t_i = 2t_i \cdot \epsilon_i$
where: $\Delta t_i$=incremental timeshift in a layer i within the formation,
$t_i$=one-way travel time of a seismic wave in a layer i in the formation, and
$\epsilon_i$=strain in the layer i.

24. The method of claim 18, wherein:
if the layer i in the geomechanical system is in a plastic regime, the incremental timeshift is defined as $$\Delta t_i = 2t_i \left( \varepsilon_i - \frac{dv_i}{v_i} \right)$$

where: $\Delta t_i$=incremental timeshift of a seismic wave,
$t_i$=one-way travel time of a seismic wave in a layer i in the formation,
$\varepsilon_i$=strain in the layer i, and $\frac{dv_i}{v_i}$ = change in wave velocity in the layer $i$ between the first and second times, divided by the original wave velocity at the first time.

25. The method of claim 24, wherein:
$dv_i$ is the change in velocity of "P" waves in the layer i between the first and second times; and
$v_i$ is the original velocity of "P" waves at the fist time.

26. The method of claim 25, wherein:

$$v_i = \sqrt{\frac{\lambda + 2\mu}{\rho}}$$

where: $\lambda$=Lame' constant,
$\mu$=shear modulus, and
$\rho$=density of the rock layer i.

27. The method of claim 24, wherein:
$dv_i$ is the change in velocity of "S" waves in the layer i between the first and second times; and
$v_i$ is the original velocity of "S" waves at the first time.

28. The method of claim 27, wherein:

$$v_i = \sqrt{\frac{\mu}{\rho}}$$

where: $\mu$=shear modulus, and
$\rho$=density of the rock layer i.

29. The method of claim 17, further comprising:
analyzing the cumulative timeshift values to identify formations that have time-lapse timeshifts to indicate a depletion of reservoir fluids.

30. The method of claim 18, further comprising:
analyzing the cumulative timeshift values to identify formations that have time-lapse timeshifts to indicate a remaining presence of reservoir fluids.

31. The method of claim 18, further comprising:
analyzing the cumulative timeshift values to identify formations that have time-lapse timeshifts to indicate a potential for mechanical wellbore failure to occur.

32. The method of claim 31, further comprising:
(i) adding one or more injectors to an area of the geomechanical system where wellbore mechanical failure is predicted to occur, (ii) spacing apart the location of future producers in the area of the geomechanical system where wellbore mechanical failure is predicted to occur, or (iii) both.

33. The method of claim 17, wherein the geomechanical simulation derives a finite element based model from a map-based geologic model.

34. The method of claim 17, further comprising:
acquiring temperature history within the physical boundaries.

35. The method of claim 17, wherein prior to running a geomechanical simulation, the method further comprises:
acquiring subsurface data for the layers comprising well logging data, seismic data, or combinations thereof;
and wherein:
the physical boundaries for the geomechanical system and the subsurface data for the layers within the physical boundaries are entered into a pre-processor program to create a three-dimensional grid in a map-based computer model, wherein the three-dimensional grid is automatically compiled from the subsurface data; and
the three-dimensional grid defines nodes in a geological structure that are converted into the nodes of the finite element mesh as a result of creating the finite element mesh.

36. The method of claim 35, wherein automatically creating a finite element mesh is performed by running a utility program that is compatible with a geomechanical solver program.

37. The method of claim 36, wherein running a geomechanical simulation for the geomechanical system is performed by running the geomechanical solver program to solve for earth stress changes.

38. The method of claim 35, wherein the three-dimensional grid is automatically compiled from well logging data into a three-dimensional digital representation using an ASCII data-to-ZMap programming function.

39. The method of claim 35, wherein the pre-processor program automatically accounts for and repairs any singular geologic entities in the rock formations such as pinchouts and erosional features.

40. A method for modeling a geomechanical system, the geomechanical system having a subsurface rock formation consisting of at least two layers comprising a hydrocarbon reservoir, the method comprising:
defining physical boundaries for the geomechanical system;
acquiring mechanical properties of layers within the rock formation and within the physical boundaries;
acquiring history for at least one reservoir characteristic from multiple wells within the physical boundaries;
obtaining a first seismic data set for the geomechanical system, the first seismic data set being taken at a first time;
acquiring subsurface data for the layers within the rock formation and within the physical boundaries;
creating a map-based geologic model from the subsurface data and the first seismic data set, the map-based geologic model defining a three-dimensional, digital representation of the geomechanical system;
deriving a finite element-based geomechanical model from the map-based geologic model;
using the finite-element-based geomechanical model, (i) determining whether the respective layers in the formation are in an elastic regime or a plastic regime, and (ii) calculating seismic wave velocities in each of the respective layers in the formation, in response to simulated changes in the at least one reservoir characteristic;
calculating incremental timeshifts for the respective layers in the formation; and calculating a cumulative timeshift value from a summation of the incremental timeshifts for the layers in the formation.

41. The method of claim 40, wherein the cumulative timeshift value is defined as:

$$\Delta T_i = \sum_i \Delta t_i$$

where: $\Delta T_i$=cumulative timeshift value for all layers in the formation, and
$\Delta t_i$=incremental timeshift in a layer i within the formation.

42. The method of claim 41, wherein the at least one reservoir characteristic comprises pore pressure history.

43. The method of claim 42, wherein changes in pore pressure within the geomechanical system are designed to simulate a decrease in pore pressure in connection with a production of hydrocarbons from the hydrocarbon reservoir.

44. The method of claim 41, wherein creating a map-based geologic model automatically accounts for and repairs singular geologic entities such as pinchouts and erosional features.

45. The method of claim 41, wherein creating a map-based geologic model comprises automatically stacking two or more rock layers within physical boundaries of the geomechanical system without having to manually stack the well logging data and the seismic data.

46. The method of claim 42, further comprising:
initializing a geostatic condition of the finite element-based geomechanical model before calculating the cumulative timeshift.

47. The method of claim 46, wherein initializing a geostatic condition of the finite element-based geomechanical model comprises reviewing well logging data, reviewing drilling records, reviewing completion test records, reviewing records of sand production from the wells within the physical boundaries of the geomechanical model, or combinations thereof.

48. The method of claim 47, wherein initializing a geostatic condition of the finite element-based geomechanical model further comprises reviewing a history of casing failures from the wells within the physical boundaries of the geomechanical model.

* * * * *